United States Patent
Komatsu et al.

(10) Patent No.: US 9,543,749 B2
(45) Date of Patent: Jan. 10, 2017

(54) DRIVER FOR SWITCHING ELEMENT AND CONTROL SYSTEM FOR ROTARY MACHINE USING THE SAME

(71) Applicant: DENSO CORPORATION, Kariya, Aichi-pref (JP)

(72) Inventors: Takeyasu Komatsu, Chiryu (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 401 days.

(21) Appl. No.: 13/947,495

(22) Filed: Jul. 22, 2013

(65) Prior Publication Data

US 2014/0021893 A1    Jan. 23, 2014

(30) Foreign Application Priority Data

Jul. 20, 2012  (JP) .................................. 2012-161497

(51) Int. Cl.
| | |
|---|---|
| H03H 7/09 | (2006.01) |
| H03K 3/00 | (2006.01) |
| H03K 5/08 | (2006.01) |
| H02P 6/14 | (2016.01) |
| H02H 3/08 | (2006.01) |
| H03K 17/082 | (2006.01) |
| H03K 17/16 | (2006.01) |

(52) U.S. Cl.
CPC ........ *H02H 3/08* (2013.01); *H02P 6/14* (2013.01); *H03K 17/0828* (2013.01); *H03K 17/166* (2013.01)

(58) Field of Classification Search
USPC ..... 318/400.09, 400.2, 400.12; 327/109, 326
See application file for complete search history.

(56) References Cited

U.S. PATENT DOCUMENTS

| 2005/0206438 A1* | 9/2005 | Higashi ............... H03K 17/166 327/427 |
|---|---|---|
| 2009/0002054 A1* | 1/2009 | Tsunoda ............ H03K 17/0406 327/374 |

(Continued)

FOREIGN PATENT DOCUMENTS

| JP | 3474775 | 9/2003 |
|---|---|---|
| JP | 2009-011049 | 1/2009 |

(Continued)

*Primary Examiner* — Paul Ip
*Assistant Examiner* — Devon Joseph
(74) *Attorney, Agent, or Firm* — Nixon & Vanderhye PC

(57) ABSTRACT

In a driver, a clamping module executes a clamping task that clamps an on-off control terminal voltage to be equal to or lower than a clamp voltage for a predetermined time during charging of the on-off control terminal of the switching element. The clamp voltage is lower than an upper limit of the voltage at the on-off control terminal of the switching element. A measuring module measures a parameter value correlated with a sense current correlated with a current flowing between input and output terminals of the switching element. A limiting module discharges the on-off control terminal to limit flow of the current between the input and output terminals if the value of the parameter exceeds a threshold. A setting module variably sets a length of the predetermined time as a function of the parameter value during charging of the switching element's on-off control terminal.

12 Claims, 14 Drawing Sheets

(56) References Cited

U.S. PATENT DOCUMENTS

| | | | |
|---|---|---|---|
| 2009/0066402 A1* | 3/2009 | Hiyama | H03K 17/168 |
| | | | 327/392 |
| 2009/0096394 A1* | 4/2009 | Taniguchi | 318/400.09 |
| 2010/0148846 A1 | 6/2010 | Hiyama | |
| 2011/0221370 A1* | 9/2011 | Fukuta | H02M 1/32 |
| | | | 318/400.27 |
| 2011/0285447 A1* | 11/2011 | Nakanishi | 327/326 |
| 2012/0194226 A1* | 8/2012 | Itou et al. | 327/109 |
| 2012/0249020 A1* | 10/2012 | Komatsu et al. | 318/139 |

FOREIGN PATENT DOCUMENTS

| | | |
|---|---|---|
| JP | 2009-071956 | 4/2009 |
| JP | 2010-246251 | 10/2010 |
| JP | 2012-217321 | 11/2012 |

* cited by examiner

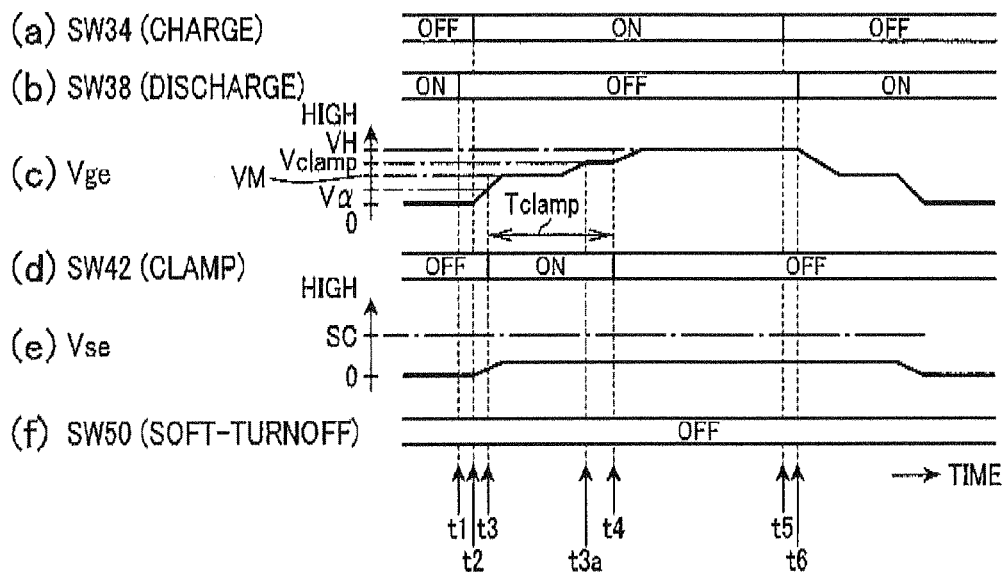
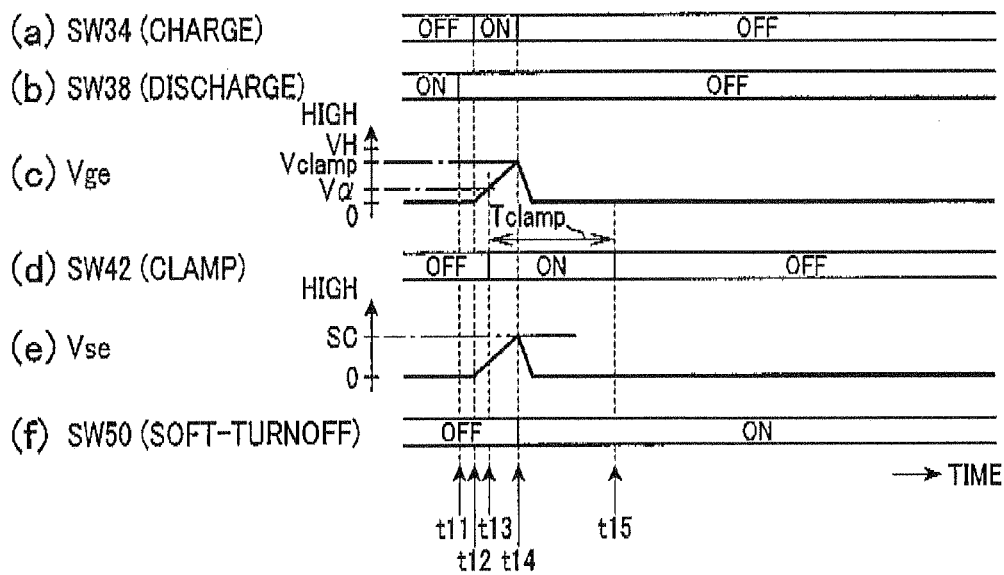

FIG.11
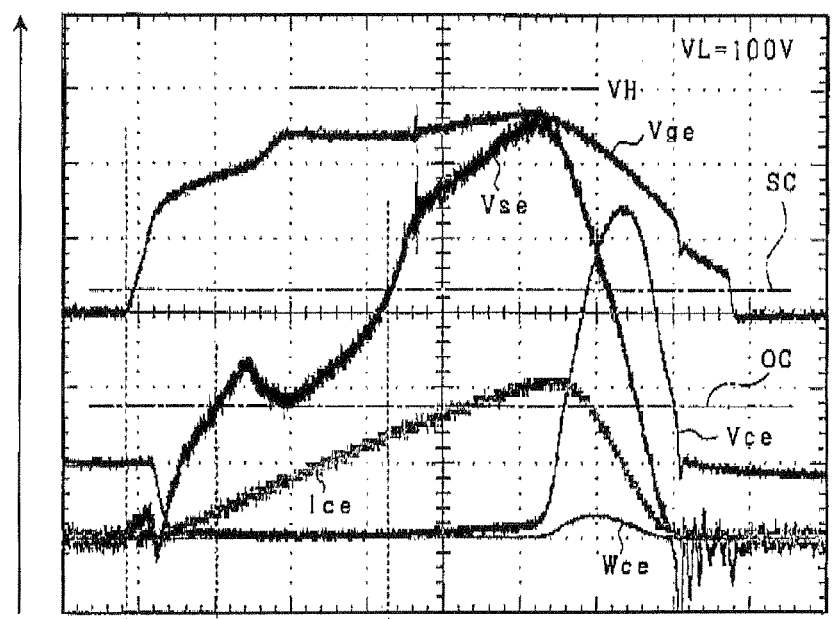
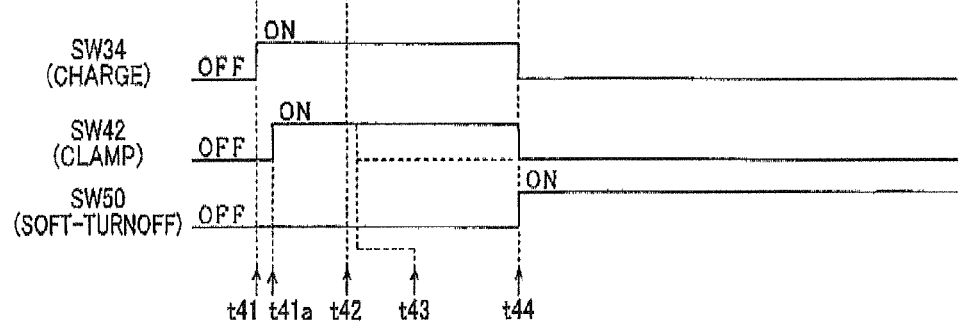

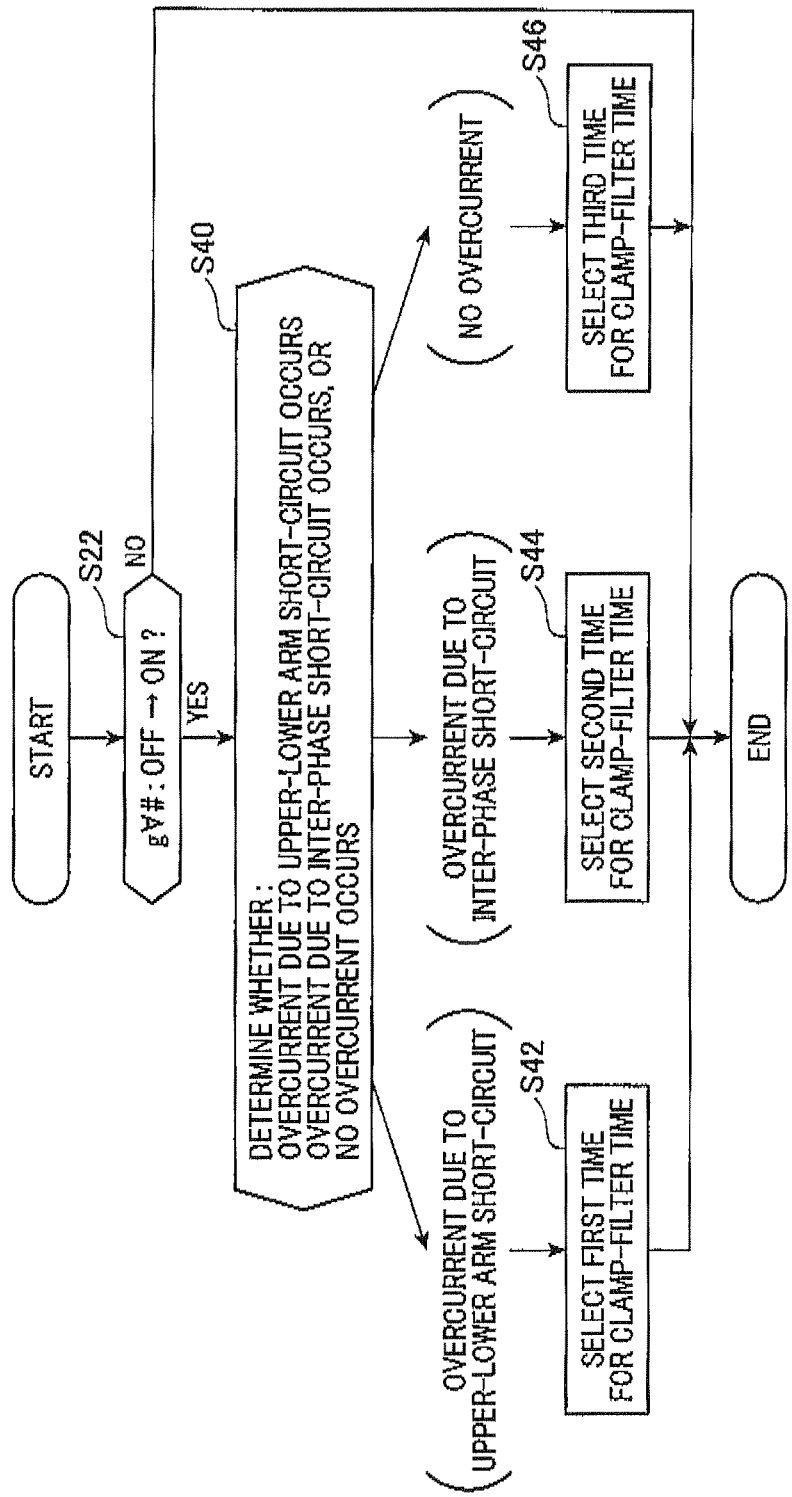

DRIVER FOR SWITCHING ELEMENT AND CONTROL SYSTEM FOR ROTARY MACHINE USING THE SAME

CROSS REFERENCE TO RELATED APPLICATIONS

This application is based on and claims the benefit of priority from Japanese Patent Application 2012-161497 filed on Jul. 20, 2012, the disclosure of which is incorporated in its entirety herein by reference.

TECHNICAL FIELD

The present disclosure relates to drivers for a switching element having a sense terminal for outputting a minute current correlated with a current flowing between the input and output terminals thereof.

BACKGROUND

A typical example of these drivers is disclosed in Japanese Patent Publication No. 3474775. The driver of an IGBT (Insulated-Gate Bipolar Transistor) as an example of switching elements includes a resistive element connecting between the sense terminal and the output terminal of the IGBT, and a comparator for comparing a sense voltage defined as the voltage difference across both ends of the resistive element with a threshold voltage.

While the IGBT is in an on state, if the sense voltage exceeds the threshold voltage as a collector current output from the IGBT excessively increases as an overcurrent, the driver determines that an overcurrent flows through the IGBT, changing the IGBT from the on state to an off state. This protects the IGBT from an overcurrent, thus maintaining the reliability of the IGBT at a high level.

SUMMARY

The inventors of this application have considered as the following technology for protecting a switching element having a sense terminal which is different from the technology disclosed in the Patent Publication No. 3474775.

Specifically, the technology is designed to limit the voltage at an on-off, i.e. an open-close, control terminal of the switching element to be equal to or lower than a clamp voltage for a predetermined time before the voltage at the on-off control terminal reaches its upper limit while the on-off control terminal of the switching element is charged in preparation for a case where an excessively high output current flows through the switching element. Note that the on-off control terminal of the switching element corresponds to the gate of an IGBT.

If the sense voltage exceeds a threshold voltage, the technology is designed to discharge the on-off control terminal of the switching element, thus turning the switching element to the off state.

Even if an output current excessively flows through the switching element as an overcurrent due to short-circuit between an upper-arm switching element of one phase and a lower-arm switching element of the same phase, the technology causes the sense voltage to exceed the threshold voltage within the period during which the voltage at the on-off control terminal is clamped to be equal to or lower than the clamp voltage. This results in reduction of the amount of the overcurrent flowing through the switching element, and in turnoff of the switching element while the voltage at the on-off control terminal is clamped to be equal to or lower than the clamp voltage. That is, it is possible to reduce the amount of the output current while the switching element is turned from the on state to the off state, thus maintaining the reliability of the switching element at a high level.

As the inventors proceed with research and development of their considered technology for protecting a switching element having a sense terminal, they face the phenomenon that, although an excessively high output current flows as an overcurrent through the switching element, limitation, i.e. clamping, of the voltage at the on-off control terminal is lost. That is, the phenomenon causes the switching element to be changed from the on state to the off state while the voltage at the on-off control terminal is unclamped. One cause of the phenomenon is probably that the increasing rate of the sense voltage varies depending on the level of the overcurrent, so that, even after the lapse of the period during which the voltage at the on-off control terminal is clamped, the sense voltage may not reach its upper limit.

The phenomenon may result in an increase of the amount of the output current, i.e. the overcurrent, while the switching element is changed from the on state to the off state, reducing the reliability of the switching element.

In view of the circumstances set forth above, one aspect of the present disclosure seeks to provide drivers for a switching element, which are designed to solve the problem set forth above.

Specifically, an alternative aspect of the present disclosure aims to provide such drivers, which are capable of preventing unclamping of the limitation of the voltage at the on-off control terminal of such a switching element although an overcurrent is likely to flow through the switching element.

According to a first exemplary aspect of the present disclosure, there is provided a driver for driving a switching element having an input terminal, an output terminal, an on-off control terminal, and a sense terminal from which a sense current correlated with a current flowing between the input and output terminals is output. The driver includes a charging module configured to charge the on-off control terminal of the switching element for turning on the switching element. The driver also includes a clamping module configured to execute a clamping task that clamps a voltage at the on-off control terminal to be equal to or lower than a predetermined voltage as a clamp voltage for predetermined time during the charge of the on-off control terminal of the switching element. The clamp voltage is lower than an upper limit of the voltage at the on-off control terminal of the switching element. The driver further includes a measuring module configured to measure a value of a parameter correlated with the sense current, and a limiting module configured to discharge the on-off control terminal to limit flow of the current between the input and output terminals if the value of the parameter measured by the measuring module exceeds a threshold value. In addition, the driver includes a setting module configured to variably set a length of the predetermined time as a function of the value of the parameter measured by the measuring module during the charge of the on-off control terminal of the switching element.

According to a second exemplary aspect of the present disclosure, there is provided a control system for controlling a rotary machine. The control system includes an inverter equipped with a pair of upper- and lower-arm switching elements, connected in series, for each of plural phases. Each of the upper-j and lower-arm switching elements has an input terminal, an output terminal, an on-off control terminal, and a sense terminal from which a sense current correlated with a current flowing between the input and output terminals is output. The control system also includes a driver for driving each of the upper- and lower-arm switching elements to thereby invert a DC voltage inputted to the inverter into an AC voltage to be supplied to the rotary machine. The driver for each of the upper- and lower-arm switching elements includes a charging module configured to charge the on-off control terminal of the corresponding switching element for turning on the corresponding switching element. The driver for each of the upper- and lower-arm switching elements also includes a clamping module configured to execute a clamping task that clamps a voltage at the control terminal to be equal to or lower than a predetermined voltage as a clamp voltage for predetermined time during the charge of the on-off control terminal of the corresponding switching element. The clamp voltage is lower than an upper limit of the voltage at the on-off control terminal of the corresponding switching element. The driver for each of the upper- and lower-arm switching elements further includes a measuring module configured to measure a value of a parameter correlated with the sense current, and a limiting module configured to discharge the on-off control terminal to limit flow of the current between the input and output terminals of the corresponding switching element if the value of the parameter measured by the measuring module exceeds a threshold value. The driver for each of the upper- and lower-arm switching elements includes a setting module configured to variably set a length of the predetermined time as a function of the value of the parameter measured by the measuring module during the charge of the on-off control terminal of the corresponding switching element.

The inventors have studied in detail the phenomenon that, although an excessively high output current flows as an overcurrent through a switching element, clamping of the voltage at the on-off control terminal has been lost for some reason, so that the switching element is changed from the on state to the off state while the voltage at the on-off control terminal is unlimited.

As the results of the study, the inventors have found out that a cause of the phenomenon is that the inductance of an actual conductive path of an overcurrent is higher than a predicted inductance of a predicted conductive path of an overcurrent. Specifically, an increase in the inductance of the actual conductive path of an overcurrent causes the rate of increase of the parameter correlated with the sense current during the charge of the on-off control terminal of the switching element to be reduced relative to a predicted rate of increase of the same parameter. This leads to the value of the parameter measured by the measuring module being below the threshold value while the voltage at the on-off control terminal is limited to be equal to or lower than the clamp voltage, resulting in the phenomenon.

At that time, if the inductance of the actual conductive path of an overcurrent is higher than the predicted inductance of the predicted conductive path thereof, the behavior of the parameter correlated with the sense current during the charge of the on-off control terminal of the switching element varies as compared with a predicted behavior of the same parameter. For this reason, the parameter correlated with the sense current during the charge of the on-off control terminal of the switching element serves as a parameter for determining whether the switching element is changed from the on state to the off state while an overcurrent flows through the switching element.

In view of the inventor's consideration of how the phenomenon occurs, the driver for driving a switching element according to the first exemplary aspect of the present disclosure is equipped with the setting module. The setting module is configured to variably set the length of the predetermined time as a function of the value of the parameter measured by the measuring module during the charge of the on-off control terminal of the switching element. Specifically, if it is determined, based on the value of the parameter, that the switching element is changed from the on state to the off state while the voltage at the on-off control terminal of the switching element is unlimited to be equal to or lower than the clamp voltage, the setting module increases the length of the predetermined time, i.e. extends the predetermined time. This makes it possible to prevent the switching element from being changed from the on state to the off state while the voltage at the on-off control terminal of the switching element is unlimited to be equal, to or lower than the clamp voltage. This results in the reliability of the switching element being maintained at a higher level.

Because the control system according to the second exemplary aspect of the present disclosure includes the aforementioned driver for each of the upper- and lower-arm switching elements of the inverter, it is possible to achieve the same effects as those achieved by the driver according to the first exemplary aspect of the present disclosure.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIG. 3 is a timing chart schematically illustrating an example of specific operations of an overcurrent protection task carried out by each drive unit while a corresponding switching element is normally operating;

FIG. 4 is a timing chart schematically illustrating an example of specific operations of the overcurrent protection task by each drive unit when there is an upper-lower arm short-circuit so that an overcurrent flows through a corresponding switching element;

FIG. 11 is a graph schematically illustrating how the same parameters as those illustrated in FIG. 7 vary based on a clamp extending task carried out by each drive unit in accordance with the clamp extending routine if an overcurrent due to an inter-phase short-circuit flows through a corresponding switching element;

FIG. 18 is a flowchart schematically illustrating a further example of the clamp extending routine carried out by each drive unit of the control system according to a modification of each of the first to fifth embodiment.

DETAILED DESCRIPTION OF EMBODIMENT

Figure 1:
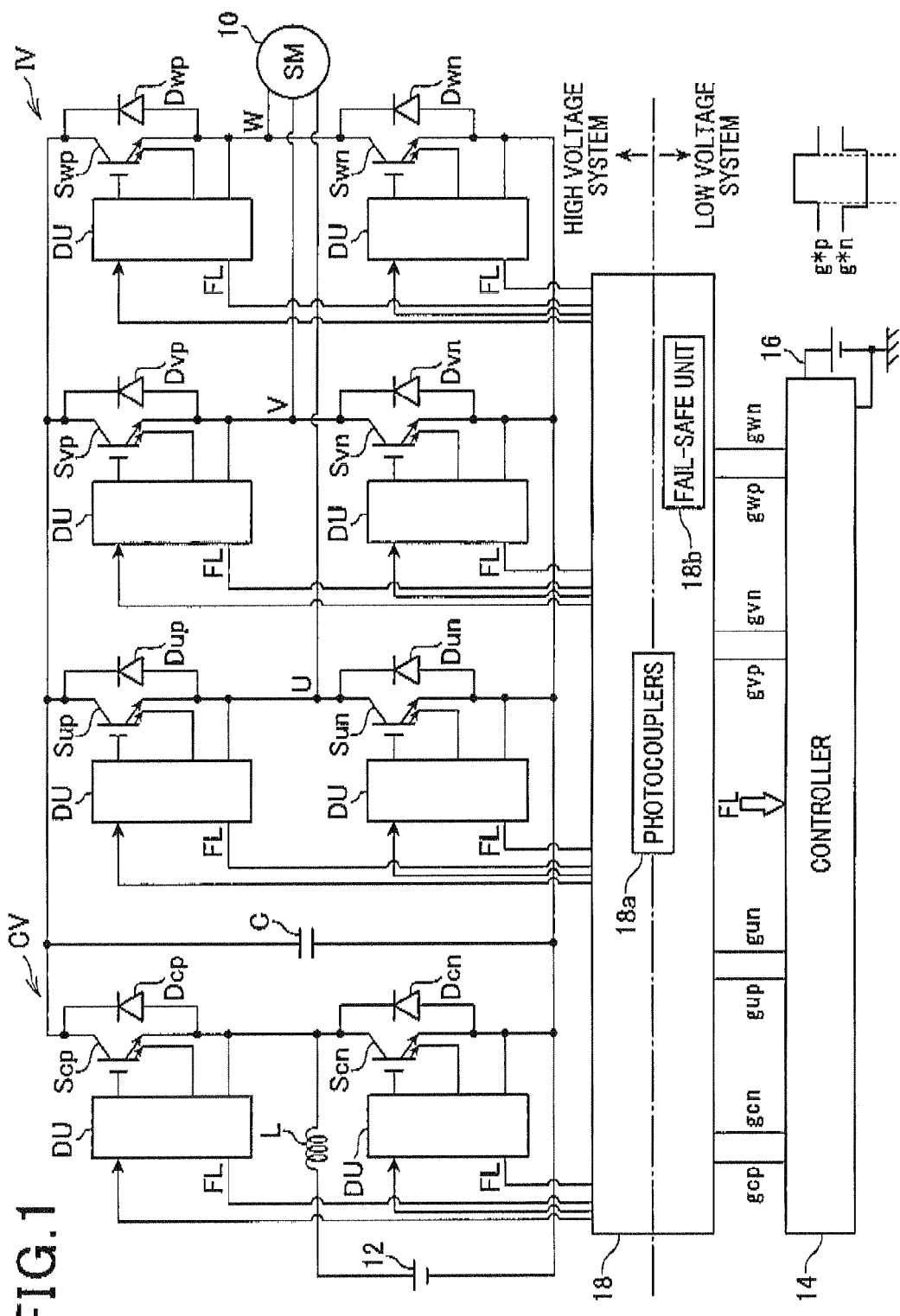
FIG. 1 is a view schematically illustrating an overall configuration of a control system for a motor-generator according to a first embodiment of the present disclosure.

Embodiments of the present disclosure will be described hereinafter with reference to the accompanying drawings. In the embodiments, like parts between the embodiments, to which like reference characters are assigned, are omitted or simplified in description to avoid redundant description.

First Embodiment

Referring to FIG. 1, there is illustrated a three-phase motor-generator as an example of rotating machines, referred to simply as a "motor-generator" 10, installed in, for example, a motor vehicle as a main engine according to the first embodiment. The motor-generator 10 is mechanically coupled to driving wheels (not shown) of the motor vehicle.

For example, as the motor-generator 10, a brushless DC motor, i.e. a three-phase SM (Synchronous Motor), is used.

The motor-generator 10 is made up of, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with an inverter INV, a converter CV, a high-voltage battery 12 as an example of DC power sources, drive units, i.e. drivers, DU, a control unit 14, a low-voltage battery 16, and an interface 18.

To the motor-generator 10, the high-voltage battery 12 is electrically connected via the inverter INV and the converter CV. The high-voltage battery 12 has a terminal voltage, which is equal to or higher than 100 V, thereacross.

The converter CV includes a capacitor C, a pair of series-connected switching elements Scp and Scn, a pair of flywheel diodes Dcp and Dcn, and a reactor L. The capacitor C is connected in parallel to the inverter INV, and the series-connected switching elements Scp and Sen are connected in parallel to the capacitor C. The flywheel diodes Dcp and Dcn are connected in antiparallel to the corresponding switching elements Scp and Scn, respectively. One end of the reactor L is connected to both the positive terminal of the high-voltage battery 12 and the connection point between the switching elements Scp and Scn. One end of the series-connected switching elements Scp and Sen of the converter CV is connected to the positive DC input line of the inverter INV, and the other end thereof is connected to the negative DC input line of the inverter INV. The negative DC input line of the inverter INV is connected to the negative terminal of the battery 12.

The converter CV is operative to convert the terminal voltage of the high-voltage battery 12 into a voltage higher than the terminal voltage of the high-voltage battery 12, and output the boosted voltage as an output DC voltage thereof across the capacitor C. The predetermined upper limit of the step-up of the terminal voltage by the converter CV is set to a predetermined high voltage, such as 666 V.

The inverter INV is designed as a three-phase inverter. The inverter INV is provided with three pairs of series-connected high- and low-side (upper- and lower-arm) switching elements Sup and Sun, Svp and Svn, and Swp and Swn. The inverter INV is also provided with flywheel diodes D∀# (∀=u, v, w, #=p, n) electrically connected in antiparallel to the corresponding switching elements S∀#(∀=u, v, w, #=p, n), respectively.

In the first embodiment, as the switching elements S*# (*=u, v, w, c, #=p, n), IGBTs are respectively used, When power MOSFETs are used as the switching elements S*# (*=u, v, w, c, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S∀p (*=u, v, w) is connected to a corresponding one of the elements S∀n (∀=u, v, w) in series is connected to a busbar and a high-voltage cable extending from the separate terminal of a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line. For example, the three-phase busbars of the three-phase connecting points of the inverter IV are connected to corresponding three-phase output terminals of a terminal holder, respectively. The three-phase output terminals of the terminal holder are connected to the three-phase high-voltage cables, respectively.

For example, the control unit 14 operates on a power-supply voltage, lower than the terminal voltage across the high-voltage battery 12, supplied from the low-voltage battery 16. Thus, the control unit 14 and the low-voltage battery 16 constitute a low voltage system. In contrast, the motor-generator 10, the converter CV, the inverter INV, and the high-voltage battery 12 constitute a high voltage system.

The interface 18 is provided with insulation members, such as photocouplers 18a, provided for the respective switching elements S*# of the inverter INV and converter CV. Each of the photocouplers 18a is comprised of a photodiode and a phototransistor. The photocouplers 18a are configured to enable communications between the high and low voltage systems while establishing electrical insulation therebetween. Specifically, each of the photocouplers 18a is configured to enable the control unit 14 to control a corresponding one of the switching elements S*# while establishing electrical insulation between the control unit 14 and a corresponding one of the switching elements S*#.

The control unit 14 is designed to individually drive the inverter INV and the converter CV to thereby control a controlled variable of the motor-generator 10, such as an output torque of the motor-generator 10.

Specifically, the control unit 14 is designed to individually send drive signals gcp and gcn, to the drive units DU provided for the respective switching elements Scp and Scn, thus individually turning on or off the respective switching elements Scp and Scn. The control unit 14 is also designed to individually send drive signals gup, gun, gyp, gvn, gwp, and gwn to the drive units DU provided for the respective switching elements Sup, Sun, Svp, Svn, Swp, and Swn, thus individually turning on or off the respective switching elements Sup, Sun, Svp, Svn, Swp, and Swn. The individual turn-on or off of the respective switching elements Sup, Sun, Svp, Svn, Swp, and Swn convert the output DC voltage across the capacitor C into an AC voltage, and supply the AC voltage to the motor-generator 10.

Each of the drive signals g*# has a predetermined duty cycle, i,e, a predetermined ratio of on duration to the total duration of each switching cycle for a corresponding one of the switching elements S*# (see FIG. 1). Specifically, the control unit 14 is designed to complementarily turn on the high- and low-side switching elements S*# for each leg (phase) via the corresponding drive units DU according to the corresponding drive signals g*#. In other words, the control unit 14 is designed to alternately turn on the high-side switching element S*p of one leg (phase) and the low-side switching element S*n of the same leg (phase). This drive alternately closes the conductive path between the collector and emitter of the high-side switching element S*p of one leg and the conductive path between the collector and emitter of the high-side switching element S*n of the same leg.

Next, an example of the circuit structure of each drive unit DU provided for a corresponding one switching element S*# will be described with reference to FIG. 2.

Figure 2:
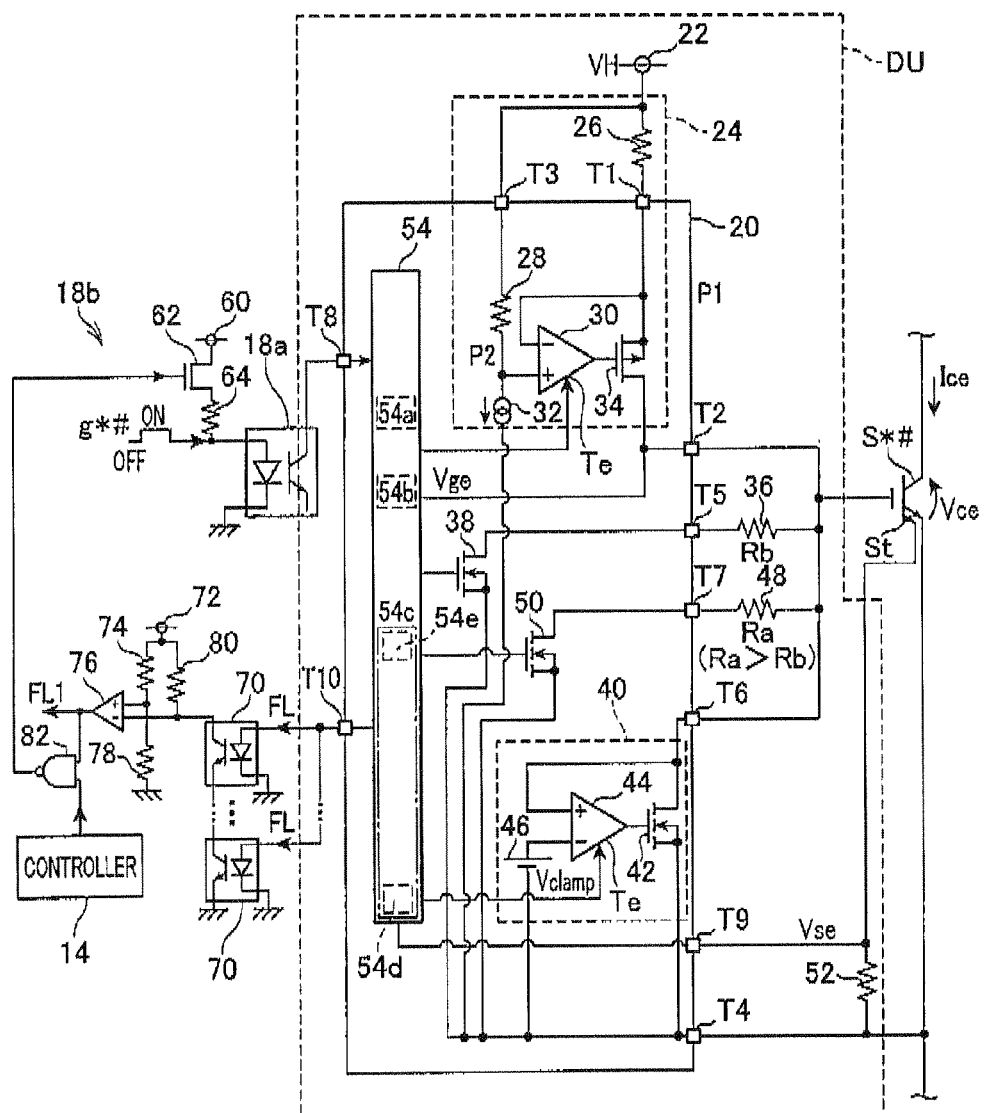
FIG. 2 is a circuit diagram schematically illustrating an example of the structure of each drive unit of the control system illustrated in FIG. 1.

Referring to FIG. 2, the drive unit DU is comprised of a drive IC 20 on a chip, a constant voltage source 22, a resistor 26, a discharging resistor 36, a soft-turnoff resistor 48, and a sense resistor 52.

The drive IC 20 has terminals T1 to T10, a resistor 28, an operational amplifier 30, a constant current power source 32, a constant-current switching element (SW) 34, a discharging switching element (SW) 38, a clamp circuit 40, a soft-turnoff switching element (SW) 50, and a drive controller 54. As the constant-current switching element 34, a P-channel MOSFET is used, and as each of the discharging and soft-turnoff switching elements 38 and 50, an N-channel MOSFET is used.

The resistors 26 and 28, the operational amplifier 30, the constant current power source 32, and the charging switching element 34 serve as a constant-current driving circuit 24.

Specifically, the constant voltage source 22 having a terminal voltage VH of for example, 15 V thereacross is connected to one end of the resistor 26. The other end of the resistor 26 is connected to the on-off control terminal, i.e. the gate, of the switching element S*# via the terminals T1 and T2. Specifically, the other end of the resistor 26 is connected to the terminal T1, the terminal T1 is connected to the source of the charging switching element 34 via a connection point P1, the drain of the charging switching element 34 is connected to the terminal T2, and the terminal T2 is connected to the gate of the switching element S*#.

The connection point between the one end of the resistor 26 and the constant voltage source 22 is connected to the terminal T4 via the terminal T3, the resistor 28, and the constant current power supply source 32. Specifically, the one end of the resistor 26 is connected to the terminal T3, and the terminal T3 is connected to one end of the resistor 28. The other end of the resistor 28 is connected to one end of the constant current power supply source 32 via a connection terminal P2, and the other end of the constant current power supply source 32 is connected to the terminal T4. The terminal T4 is connected to the output terminal, i.e. the emitter, of the switching element S*# via a common reference-potential line. In this embodiment, the potential at the emitter of the switching element S*# is set to 0 V.

The operational amplifier 30 has a non-inverting input terminal, an inverting input terminal, and an output terminal. The connection point P2 between the other end of the resistor 28 and the one end of the constant current power supply source 32 is connected to the non-inverting input terminal of the operational amplifier 30. The inverting input terminal of the operational amplifier 30 is connected to the connection point P1 between the terminal T1 and the source of the constant-current switching element 34. The output terminal of the operational amplifier 30 is connected to the gate of the constant-current switching element 34.

In the first embodiment, the operational amplifier 30 has an enable terminal Te connected to the drive controller 54. As described later, while an enable signal is input to the enable terminal of the operational amplifier 30 from the drive controller 54, the operational amplifier 30 is activated. The resistances of the resistors 26 and 28 are set such that the voltage input to the non-inverting input terminal of the operational amplifier 30 based on the terminal voltage VH of the constant voltage source 22 is higher than that input to the inverting input terminal thereof based on the terminal voltage VH.

When activated, the operational amplifier 33 outputs a high-level signal to be applied to the gate of the constant-current switching element 34, thus turning ON the constant-current switching element 34. This causes the voltage at the connection point P1 between the terminal T1 and the source of the constant-current switching element 34 to be applied to the gate of the switching element S*# via the terminal T2. The voltage at the connection point P1 between the terminal T1 and the source of the constant-current switching element 34 is a constant voltage defined based on the terminal voltage VH of the constant voltage source 22 and the resistance of the resistor 26. This results in the gate of the switching element S*# being charged by a constant charging current based on the constant voltage at the connection point P1. In other words, a charging task for the gate of the switching element S*# is carried out as a constant-current control task.

The gate voltage, i.e. the gate-emitter voltage, Vge of the switching element S*# is clamped by a clamping task described later. Thus, if a charge current for the switching element S*# were controlled as a function of the gate voltage Vge of the switching element S*#, limitation of the gate voltage Vge could reduce the charge current, resulting in an increase of the "Miller" period of the switching element S*#. The Miller period represents a period during which the gate voltage Vge, which has risen up to a Miller voltage VM in response to a turn-on drive signal, remains at the Miller voltage in order to charge the gate-drain capacitance, and thereafter, the gate voltage Vge rises to its upper limit while the switching element S*# is turned ON.

However, in the first embodiment, adjusting the charge current to a constant value permits the gate of the switching element S*# to be charged by the constant value of the charge current even if the gate voltage Vge is limited. This prevents the Miller period from increasing, thus preventing the reduction in the switching speed of the switching element S*#, i.e. the increase in the switching loss thereof.

The gate of the switching element S*# is also connected to one end of the discharging resistor 36, and the other end of the discharging resistor 36 is connected to the terminal T5. The terminal T5 is connected to the drain of the discharging switching element 38, and the source of the discharging switching element 38 is connected to the terminal T4, i.e. the common potential line. The gate of the discharging switching element 38 is connected to the drive controller 54. In other words, the gate of the switching element S*# is connected to the terminal T4 via the discharging resistor 36, the terminal T5, and the discharging switching element 38.

In addition, the gate of the switching element S*# is connected to the clamp circuit 40 via the terminal T6.

The clamp circuit 40 is comprised of a clamping switching element 42, an operational amplifier, such as a high-speed operational amplifier, 44, and a power source 46. As the clamping switching element 42, an N-channel MOSFET is used. Specifically, the operational amplifier 44 has a non-inverting input terminal, an inverting input terminal, and an output terminal. The terminal T6 is connected to the drain of the clamping switching element 42, and the source of the clamping switching element 42 is connected to the terminal T4. The connection point between the terminal T6 and the drain of the clamping switching element 42 is connected to the non-inverting input terminal of the operational amplifier 44. The inverting input terminal of the operational amplifier 44 is connected to the positive terminal of the power source 46, and the negative terminal of the power source 46 is connected to the terminal T4. The gate of the clamping switching element 42 is connected to the output terminal of the operational amplifier 44. The operational amplifier 44 has an enable terminal Te connected to the drive controller 54. As described later, while an enable signal is input to the enable terminal of the operational amplifier 44 from the drive controller 54, the operational amplifier 44 is activated.

The power source 46 has a terminal voltage, referred to as a clamp voltage $V_{clamp}$, determined to limit the voltage applied to the on-off control terminal of the switching element S*#, i.e. the gate voltage Vge of the switching element S*#, to a value that can prevent a current, whose value may excessively reduce the reliability of the switching element S*#, from flowing through the switching element S*#. Specifically, in the first embodiment, the clamp voltage $V_{clamp}$ is set to be equal to or higher than the Miller voltage VM of the switching element S*#, and to be lower than an upper limit VH of the gate voltage Vge, i.e. the terminal voltage VH of the constant voltage source 22. For example, the clamp voltage $V_{clamp}$ is set to 12.5 V.

Moreover, the gate of the switching element S*# is connected to one end of the soft-turnoff resistor 48, and, the other end of the soft-turnoff resistor 48 is connected to the terminal T7. The terminal T7 is connected to the drain of the soft-turnoff switching element 50, and the source of the soft-turnoff switching element 50 is connected to the terminal T4, i.e. the common potential line. The gate of the soft-turnoff switching element 50 is connected to the drive controller 54. In other words, the gate of the switching element S*# is connected to the terminal T4 via the soft-turnoff resistor 48, the terminal T7, and the soft-turnoff switching element 50.

The switching element S*# has a sense terminal St for outputting a minute current, i.e. a sense current, positively associated with a current, i.e. a collector current Ice, flowing through the conductive path between the input terminal and the output terminal thereof, i.e. between the collector and the emitter thereof. For example, the magnitude of the minute current is 0.01% of that of the collector current Ice.

The sense terminal St is connected to a first end of the resistor 52, and a second end, opposing the first end, of the resistor 52 is connected to the emitter of the switching element S*# via the common potential line of the drive unit DU. The sense terminal St is also connected to the drive controller 54 via the terminal T9.

When the collector current Ice flows through the conductive path of the switching element S*#, a minute current correlated with the collector current Ice flows through the resistor 52, so that a voltage drop across the resistor 52 occurs. The drive controller 54 obtains the voltage drop across the resistor 52 as a sense voltage Vse at the first end of the resistor 52 connected to the sense terminal St. In other words, the resistor 52 serves as, for example, a measuring module for measuring the sense voltage Vse as a parameter correlated with the sense current output from the sense terminal St. This measurement obtains, as the measured level of the sense voltage Vse, an electric state quantity of the magnitude of the collector current Ice flowing through the switching element S*#; the electric state quantity is correlated with the magnitude of the collector current Ice. That is, the level of the sense voltage Vse is as a function of, i.e. correlates with, the magnitude of the collector current flowing through the switching element S*#.

In the first embodiment, the positive polarity of sense voltage Vse is defined when the potential at the first end of the resistor 52 connected to the sense terminal St is higher than the potential at the emitter of the switching element S*#. As described above, the potential at the emitter of the switching element S*# is set to zero.

The drive controller 54 is operative to receive the drive signal g*# input thereto from the controller 14 via the interface 18 and the terminal T8. The drive signal g*# has one of a predetermined first logical level, i.e. a high level, defined as an on command, and a predetermined second logical level, i.e. a low level, defied as an off command.

The drive controller 54 is operative to alternately turn on the constant-current switching element 34 and the discharging switching element 38 using the drive signal g*#, thus alternately performing the charging task, i.e. the constant-current control task, and a discharging task for the gate of the switching element S*#.

Specifically, the drive controller 54 functionally includes a charging unit 54a and a discharging unit 54b. The charging unit 54a and the constant-current driving circuit 24 serve as, for example, a charging module, and the discharging unit 54b, the discharging switching element 38, and the discharging resistor 36 serve as, for example, a discharging module.

The charging unit 54a of the drive controller 54 turns off the discharging switching element 38 and outputs the enable signal to the enable terminal of the operational amplifier 30 to turn on the constant-current switching element 34 if the drive signal g*# has the high level showing the on command. The turn-on of the constant-current switching element 34 with the turn-off of the discharging switching element 38 charges the gate of the switching element S*# based on the constant charging current supplied to the gate thereof. This changes the switching element S*# from the off state to the on state.

On the other hand, if the drive signal *# input to the drive controller 54 is changed from the high level to the low level showing the off command, the charging unit 54a turns on the discharging switching element 38 and shuts off the output of the enable signal to the enable terminal of the operational amplifier 30. This turns off the constant-current switching element 34. The turn-on of the discharging switching element 38 discharges the gate of the switching element S*# through the discharging switching element 38, thus changing the switching element S*# from the on state to the off state.

In addition, the drive controller 54 is operative to perform an overcurrent protection task based on the gate voltage Vge input thereto via the terminal T2, the sense voltage Vse input thereto via the terminal T9, and the like. The overcurrent protection task includes the clamping task and a soft turn-off task. Specifically, the drive controller 54 functionally includes an overcurrent protection unit 54c. The overcurrent protection unit 54c functionally includes a clamping unit 54d and a soft-turnoff unit 54e. The clamping unit 54d, the clamping switching element 42, the operational amplifier 44, and the power source 46 serve as, for example, a clamping module. The soft-turnoff unit 54e, the soft-turnoff switching element 50, and the soft-turnoff resistor 48 serve as, for example, a limiting module.

First, let us describe the clamping task.

The clamping unit 54d performs the clamping task to output the enable signal to the enable terminal of the operational amplifier 44 for a predetermined time interval $T_{clamp}$ before the arrival of the gate voltage Vge at the upper limit VH while the gate of the switching element S*# is charged in response to the on command of the drive signal g*#. The enable signal output to the enable terminal of the operational amplifier 44 turns on the clamping switching element 42. For example, the predetermined time interval $T_{clamp}$ will be referred to as clamp-filter time $T_{clamp}$, and is set to 1.6 μs. The clamping task permits, when there is an upper-lower arm short-circuit, the collector current Ice flowing through the switching element S*# to be limited until the switching element S*# is switched to the off state by the soft-turnoff task described later.

Note that the upper-lower arm short-circuit means that simultaneous turn-on of a high-side switching element S*p of one phase and a low-side switching element S*n of the same phase produces a conductive path of an overcurrent, i.e. a short-circuit current, for the pair of high- and low-side switching elements S*# of the same phase. That is, the conductive path of an overcurrent for the upper-lower arm short-circuit is established between a high-side switching element S*p of one phase and a low-side switching element S*n of the same phase without passing through the motor-generator 10, i.e. the load. For example, the upper-lower arm short-circuit is caused when one of a high- and low-side switching elements S*p and S*n of one phase is switched to the on state while there is a short-circuit in the other thereof.

Next, let us describe the soft-turnoff task.

Note that, in the first embodiment, the soft-turnoff resistor 48 has a resistance Ra, and the discharging resistor 36 has a resistance Rb, the resistance Ra is higher than the resistance Rb.

The soft-turnoff unit 54e performs the soft-turnoff task to turn off the constant-current switching element 34 and the soft-turnoff switching element 50 if it is determined that the sense voltage Vse exceeds a first threshold voltage SC. The first threshold voltage SC is set to a lower limit of the sense voltage Vse if a value of the collector current Vce, which could cause the reliability of the switching element S*# not to be maintained, flows through the switching element S*#. The soft-turnoff task discharges the gate of the switching element S*# via the soft-turnoff switching element S*#, thus turning off the switching element S*# slowly.

Specifically, the resistance of the discharge path of the gate of the switching element S*# via the soft-turnoff switching element S*# and resistor 48 is higher than that of the discharge path of the gate of the switching element S*# via the discharging switching element 38 and resistor 36.

If the switching speed of the switching element S*# from the on state to the off state were high while the collector current Ice having an excessively high value flows through the switching element S*# as an overcurrent, there might be an excessively high surge voltage produced due to the high-speed shutdown of the switching element S*#. Thus, in this situation, the soft-turnoff task forcibly changes the resistance of the discharge path of the gate of the switching element S*# via the soft-turnoff resistor 48 to be higher than that of discharge path of the gate of the switching element S*# via the discharging resistor 36 in normal situations. This prevents the magnitude of a surge produced clue to the turn-off of the switching element 8*# from being suppressed.

When executing the soft-turnoff task, the soft-turnoff unit 54e of the drive controller 54 executes a task to output a fail-safe signal FL and a task to disable the drive of each of the constant-current switching element 34 and the discharging switching element 38. The fail-safe signal FL represents an abnormal state in the operation of the switching element S'#, and is output to the interface 18 via the terminal T10.

The interface 18 is comprised of a fail-safe unit 18b illustrated in FIG. 1, and the fail-safe unit 18b shuts down each of the inverter INV and the converter CV in response to the fail-safe signal FL.

An example of the structure of the fail-safe unit 18b is illustrated in FIG. 2.

Specifically, the fail-safe unit 18b is comprised of a set of a low-voltage power source 60, an active-low switching element 62, and a resistor 64 provided for each of the photocouplers 18a. The fail-safe unit 18b is also comprised of a photocoupler 70 for each switching element S*#, a low-voltage power source 72, a resistor 74, a comparator 76, resistors 78 and 80, and a NAND gate 82.

One end of the photodiode of each of the photocouplers 18a is connected to one end of the resistor 64 and the control unit 14, and the other end thereof is grounded. The other end of the resistor 64 is connected to the low-voltage power source 60 via the switching element 62. The control terminal of the switching element 62 is connected to an output terminal of the NAND gate 82. Each of the photocouplers 18a is ON if a low-voltage signal is inputted to a corresponding one of the switching elements 62 so that the photodiode is energized and the phototransistor is ON. Otherwise, each of the photocouplers 18a is OFF if a high-voltage signal is inputted to a corresponding one of the switching elements 62 so that the photodiode is de-energized and the phototransistor is OFF. While the photocoupler 18a is ON, information based on the drive signal *# is input to the drive controller 54 via the terminal T8.

Each of the photocouplers 70 is comprised of a photodiode and a phototransistor. One end of the photodiode of each of the photocouplers is connected to the terminal T10, and the other end thereof is grounded. The phototransistors of the respective photocouplers 70 are connected in series to constitute a series-connected photocoupler module. One end terminal of the series-connected photocoupler module is connected to the inverting input terminal of the comparator 76, and the other end terminal is grounded. The resistors 74 and 78 constitute a voltage divider that divides a voltage applied from the low-voltage source 72, and the divided voltage by the voltage divider is inputted to the non-inverting input terminal of the comparator 76. The low-voltage source 72 is also connected to the inverting input terminal of the comparator 76 via, the resistor 80.

If no fail-safe signals FL are output from the drive controller 54, the inverting input terminal of the comparator 76 is grounded, so that a voltage signal with a low level is output from the comparator 76 to the control unit 14. In contrast, if a fail-safe signal FL for at least one switching element S*#, referred to as a target switching element S*#, is output from the drive controller 54, the photocoupler 70 for the target switching element S*# is turned off. The turnoff of the photocoupler 70 causes a voltage applied from the low-voltage battery 72 to the inverting input terminal of the comparator 76 to be higher than the divided voltage applied to the non-inverting input terminal of the comparator 76, resulting in inversion of the low level of the voltage signal output from the comparator 76 to a high level. The high-level voltage signal of the comparator 76 is sent to the control unit 14 and the NAND gate 82.

The NAND gate 82 has two input terminals, one of which is connected to the output terminal of the comparator 76, and the other thereof is connected to the control unit 14. Thus, the high-level voltage signal output from the comparator 76 is inputted to the control unit 14 as a fail-safe signal FL1.

The control unit 14 is operative to normally output a voltage signal having a high level to the NAND gate 82 via the other input terminal if the fail-safe signal FL1 is not input thereto. Thus, if no fail-safe signals FL are output from the drive controller 54 so that the high-level voltage signal is output from the comparator 76, a voltage signal having a low level is output from the NAND gate 82 to the control terminals of the active-low switching elements 62 provided for the respective switching elements S*#. Thus, the active-low switching elements 62 are turned on or kept on, so that the switching elements S*# are ON. That is, if no fail-safe signals FL are output from the drive controller 54, the switching elements S*# are ON.

In contrast, if a fail-safe signal FL for at least one switching element S*# is output from the drive controller 54 so that the low-level voltage signal is output from the comparator 76, a voltage signal having a high level is output from the NAND gate 82 to the control terminals of the active-low switching elements 62 provided for the respective switching elements S*#. Thus, the active-low switching elements 62 are turned off or kept off, so that all the switching elements S*# are OFF. That is, if at least one fail-safe signal FL is output from the drive controller 54, all the switching elements S*# are OFF, so that each of the inverter INV and converter CV are shut down.

Next, let us further describe in detail the overcurrent protection task using FIGS. 3 and 4.

FIG. 3 schematically illustrates an example of specific operations of the overcurrent protection task executed by the drive controller 54 of the drive unit DU while the corresponding switching element S*# is normally operating, i.e. no overcurrent flows through the corresponding switching element S*#. How the constant-current switching element 34 is driven is illustrated in (a) of FIG. 3, and how the discharging switching element 38 is driven is illustrated in (b) of FIG. 3. How the voltage Vge varies is illustrated in (c) of FIG. 3, and how the clamping switching element 42 is driven is illustrated in (d) of FIG. 3. How the sense voltage Vse varies is illustrated in (e) of FIG. 3, and how the soft-turnoff switching element 50 is driven is illustrated in (f) of FIG. 3.

Referring to FIG. 3, when the discharging switching element 38 is turned off at time t1, and thereafter, the constant-current switching element 34 is turned on at time t2. These operations cause the gate voltage Vge to start increasing. The increase in the gate voltage Vge causes the collector current Ice to start flowing, resulting in an increase of the sense voltage Vge.

Thereafter, when the gate voltage Vge reaches a preset voltage V$\alpha$, which is set to be lower than the Miller voltage VM, at time t3, the drive controller 54 starts output of the enable signal to the operational amplifier 44. This results in execution of the clamping task, which turns on the clamping switching element, and maintains it in the on state for the clamp-filter time $T_{clamp}$ from the time t3. At that time, if the gate voltage Vge is lower than the clamp voltage $V_{clamp}$, the gate voltage Vge increases. However, if the gate voltage Vge becomes equal to the clamp voltage $V_{clamp}$ at time t3a, the gate voltage Vge is limited to the clamp voltage $V_{clamp}$.

Specifically, the damping task limits the gate voltage Vge to be equal to or lower than the clamp voltage $V_{clamp}$ before reaching its upper limit VH. Note that, in the example of the specific operations of the overcurrent protection task illustrated in FIG. 3, the sense voltage Vse does not reach the first threshold SC because no overcurrent flows through the switching element S*#.

Specifically, during the clamp-filter time $T_{clamp}$, the gate voltage Vge, which has risen up to the Miller voltage VM, is stayed at the Miller voltage VM at the Miller period. Thereafter, the gate voltage Vge rises to the clamp voltage $V_{clamp}$, and the gate voltage Vge is maintained at the clamp voltage $V_{clamp}$.

Thereafter, at time t4 when the clamp-filter time $T_{clamp}$ has elapsed since the time t3, the output of the enable signal to the operational amplifier 44 is stopped, resulting in turning off the clamping switching element 42. This causes the gate voltage Vge to increase again up to the upper limit VH, thus turning on the switching element S*#.

Thereafter, the constant-current switching element 34 is switched from the on state to the off state at time t5, and thereafter the discharging switching element 38 is switched from the off state to the on state at time t6.

Next, FIG. 4 schematically illustrates an example of specific operations of the overcurrent protection task by the drive controller 54 of the drive unit DU when there is an upper-lower arm short-circuit so that an overcurrent flows through the switching element S*#. (a) to (f) of FIG. 4 respectively correspond to (a) to (f) of FIG. 3.

Referring to FIG. 4, when the discharging switching element 38 is turned off at time t11, and thereafter, the constant-current switching element 34 is turned on at time t12. These operations cause the gate voltage Vge to start increasing. The increase in the gate voltage Vge causes the collector current Ice to start flowing, resulting in an increase of the sense voltage Vge.

Thereafter, when the gate voltage Vge reaches the preset voltage Vα at time t13, the drive controller 54 starts output of the enable signal to the operational amplifier 44. This results in execution of the clamping task, which turns on the clamping switching element 42 at the time t13, and maintains it in the on state for the clamp-filter time $T_{clamp}$ from the time t13.

The clamp-filter time $T_{clamp}$ according to the first embodiment is set to be slightly longer than a maximum value of time required from the timing when the gate voltage Vge exceeds the preset voltage Vα to the timing when the sense voltage Vse exceeds the first threshold voltage SC while there is an upper-lower arm short-circuit. The maximum value of the time required from the timing when the gate voltage Vge exceeds the preset voltage Vα to the timing when the sense voltage Vse exceeds the first threshold voltage SC while there is an upper-lower arm short-circuit can be determined experimentally, empirically, and/or theoretically.

For this reason, in the example of the specific operations of the overcurrent protection task illustrated in FIG. 4, the sense voltage Vse exceeds the first threshold voltage SC at time t14 within the clamp-filter time $T_{clamp}$. Thus, at the time t14, the soft-turnoff task that turns off the soft-turnoff switching element 50 is carried out, causing the switching element S*# to be forcibly turned off. After the time t14, when the clamp-filter time $T_{clamp}$ has elapsed at time t15, the clamping switching element 42 is switched from the on state to the off state.

Let us consider, as another factor that causes an overcurrent, i.e. a short-circuit current, to flow through a switching element S∀# (∀=u, v, or w, #=p or n) of the inverter IV, an inter-phase short-circuit.

Note that the inter-phase short-circuit may occur while at least two of the electrical paths between the motor-generator 10 and the inverter IV for the respective three-phases are short-circuited. This short-circuit situation is caused when the busbar or the high-voltage cable of the electrical path between the motor-generator 10 and the inverter IV for one phase and the busbar or the high-voltage cable of the electrical path therebetween for another phase are short-circuited. In addition, this short-circuit situation is caused when two-phase output terminals of the terminal holder are short-circuited, or two of the three-phase electrical paths established in the motor-generator 10 are short-circuited.

Specifically, under the short-circuit situation, the inter-phase short-circuit means that simultaneous turn-on of a high-side switching element of one of the short-circuited at least two-phases and a low-side switching element of the other thereof produces a conductive path of an overcurrent between the high- and low-side switching elements. That is, the conductive path of an overcurrent for the inter-phase short-circuit is established between a high-side switching element of one of the short-circuited at least two-phases and a low-side switching element of the other thereof without passing through the motor-generator 10, i.e. the load.

Figure 5:
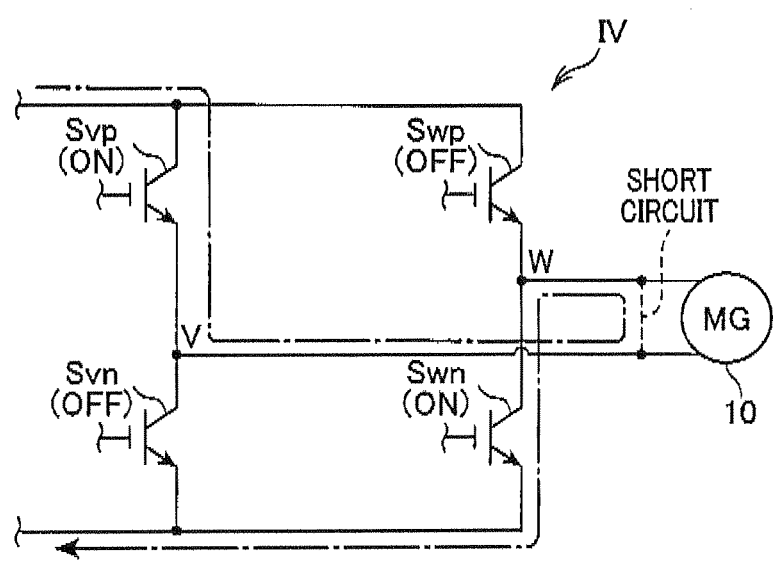
FIG. 5 is a view schematically illustrating V-phase upper and lower arms and W-phase upper and lower arms of an inverter and a motor-generator excerpted from the overall structure of the control system and the motor-generator illustrated in FIG. 1.

FIG. 5 schematically illustrates the V-phase upper and lower arms and the W-phase upper and lower arms of the inverter IV and the motor-generator 10 excerpted from the overall structure of the control system 100 and the motor-generator 10 illustrated in FIG. 1.

FIG. 5 shows that, while the electrical paths between the motor-generator 10 and the inverter IV for the V- and W-phases are short-circuited, an inter-phase short-circuit between the V-phase and the W-phase occurs. Specifically, simultaneous turn-on of the high-side switching element Svp of the V-phase and the low-side switching element Swn of the W-phase produces a conductive path of an overcurrent between the high- and low-side switching elements Svp and Swn without passing the motor-generator 10.

An inter-phase short-circuit may make it difficult to immediately perform the soft-turnoff task although an overcurrent is likely to flow through the switching element S*#.

Next, why an inter-phase short-circuit may interfere rapid execution of the soft-turnoff task irrespective of the situation under which an overcurrent is likely to flow through the switching element S∀# will be described hereinafter with reference to FIGS. 6 and 7.

Figure 6:
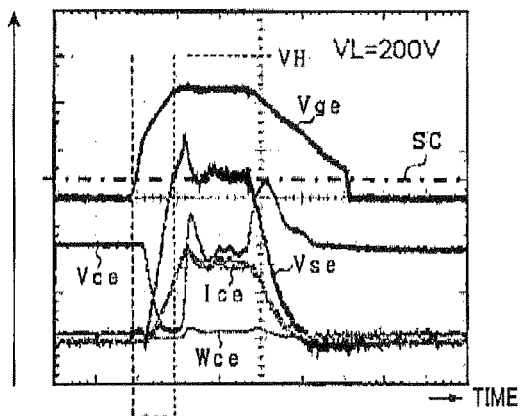
FIG. 6 is a graph schematically illustrating how a gate voltage, a sense voltage, a collector-emitter voltage, a collector current, a loss of a switching element, and, the operating state of each of a constant-current switching element, a clamping switching element, and a soft-turnoff switching element vary if an overcurrent due to an upper-lower arm short-circuit flows through a switching element.

FIG. 6 schematically illustrates how the gate voltage Vge, the sense voltage Vse, the collector-emitter voltage Vce, the collector current Ice, a loss Wce of the switching element S∀#, and the operating state of each of the switching elements 34, 42, and 50 vary if an overcurrent due to an upper-lower arm short-circuit flows through a switching element S∀#. The loss Wce of the switching element S∀# means the product of the collector-emitter voltage Vce and the collector current Ice.

Particularly, FIG. 6 schematically illustrates how these parameters vary if there is an upper-lower arm short-circuit and the collector-emitter voltage Vce, in other words, the voltage across both ends of the conductive path of the switching element S∀#, is high during the off state of the switching element S∀#. For example, in FIG. 6, an input voltage VL to the inverter IV during the off state of the switching element S∀# is 200 V.

Figure 7:
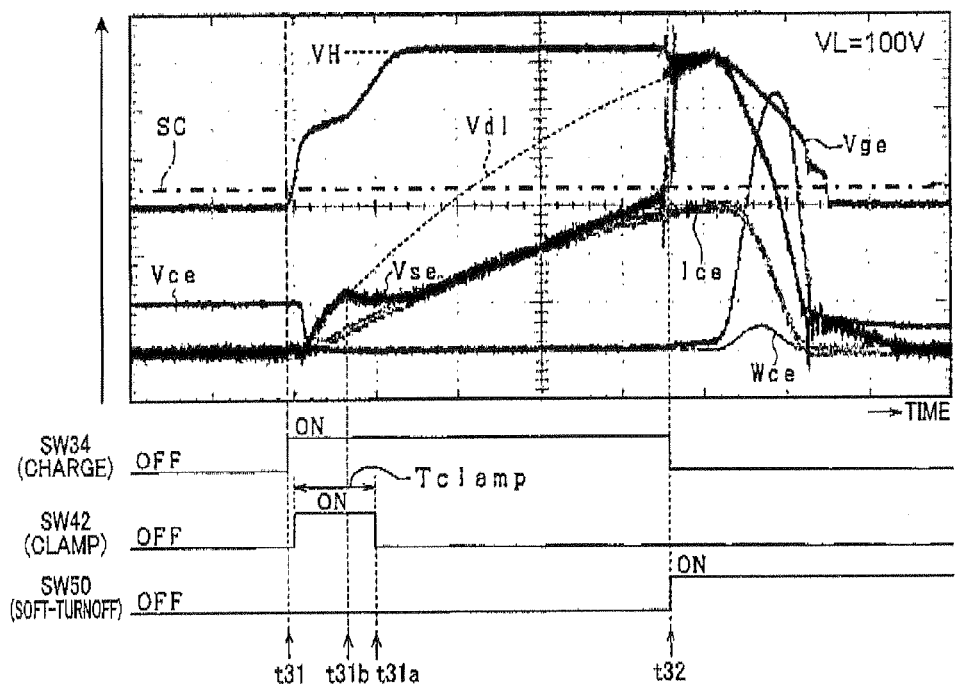
FIG. 7 is a graph schematically illustrates how the same parameters vary if an overcurrent due to an inter-phase short-circuit flows through a switching element.

In contrast, FIG. 7 schematically illustrates how the same parameters vary if an overcurrent due to an inter-phase short-circuit flows through a switching element S∀#, Particularly, FIG. 7 schematically illustrates how these parameters vary if there is an inter-phase short-circuit and the collector-emitter voltage is Vce is low during the off state of the switching element S∀#. For example, in FIG. 7, the input voltage VL to the inverter IV during the off state of the switching element S∀# is 100 V.

In other words, in each of FIGS. 6 and 7, the corresponding parameters vary assuming that a clamp extending task according to the first embodiment, which will be described later, is not carried out by the drive controller 54.

In each of FIGS. 6 and 7, the horizontal axis represents time with the same scale, and the vertical ads represents level of each of the parameters with the same scale.

For the case of an upper-lower arm short-circuit illustrated in FIG. 6, the period from time t21 to time t22 shows a period during which the constant-current switching element 34 is in the on state. Similarly, for the case of an inter-phase short-circuit illustrated in FIG. 7, the period from time t31 to time t32 shows a period during which the constant-current switching element 34 is in the on state.

As evidenced by comparison between the waveforms of the collector currents Ice in the respective FIGS. 6 and 7, the rate of increase of the collector current Ice during the period from the time t31 to the time t32 illustrated in FIG. 7 is lower than that of the collector current Ice during the period from the time t21 to the time t22 illustrated in FIG. 6. For the case of an inter-phase short-circuit illustrated in FIG. 7, the rate of increase of the collector current Ice during the period from the time t31 to the time t32 is 580 A/μsec as an example. In contrast, for the case of an upper-lower arm short-circuit illustrated in FIG. 6, the rate of increase of the collector current Ice during the period from the time t21 to the time t22 is 2000 A/μsec as an example. The reasons why are as follows:

First, the conductive path of an overcurrent between a high-side switching element of one of the short-circuited two phases and a low-side switching element of the other thereof for the case of an inter-phase short-circuit will be referred to as a first overcurrent conductive path. For the case of an upper-lower arm short-circuit, the conductive path between high- and low-side switching elements of the short-circuited phase will be referred to as a second overcurrent conductive path.

At that time, the length of the first overcurrent conductive path is longer than that of the second overcurrent conductive path. This is because the first overcurrent conductive path is defined between the high- and low-side switching elements of the different phases, but the second overcurrent conductive path is defined between the high- and low-side switching elements of the same phase.

Because the length of the first overcurrent conductive path is longer than that of the second overcurrent conductive path, the inductance of the first conductive path, such as 182,5 nH, is greater than that of the second conductive path, such as 60.3 nH, The difference between the rate of increase of the collector current Ice for the case of an inter-phase short-circuit and that of the collector current Ice for the case of an upper-lower arm short-circuit causes:

the rate of increase of the sense voltage Vse during the on period of the constant-current switching element 34 for the case of an inter-phase short-circuit to be lower than that of the sense voltage Vse during the on period of the constant-current switching element 34 for the case of an upper-lower arm short-circuit.

An inter-phase short-circuit causes the collector-emitter voltage Vce during the on state of the constant-current switching element 34 to be lower than that during the on state of the constant-current switching element 34 for the case of an upper-lower arm short-circuit. The reasons why are as follows:

As described above, the first overcurrent conductive path for the case of an inter-phase short-circuit is longer than that of the second overcurrent conductive path for the case of an upper-lower arm short-circuit. In other words, the length of the portion, i.e. the busbar portion, of the first overcurrent conductive path between the emitter of a high-side switching element of one of the short-circuited two phases and the collector of a low-side switching element of the other thereof is longer than the corresponding busbar portion of the second overcurrent conductive path.

Thus, the voltage drop across the busbar portion of the first overcurrent conductive path is greater than that across the corresponding busbar portion of the second overcurrent conductive path.

In the case of a short-circuit, the input voltage to the inverter IV is divided into:

a voltage applied to the busbar portion between the emitter of the short-circuited high-side switching element and the collector of the short-circuited low-side switching element; and a collector-emitter voltage Vce applied across each of the short-circuited high- and low-side switching elements.

Thus, an increase in the voltage applied to the busbar portion between the emitter of the short-circuited high-side switching element and the collector of the shaft-circuited low-side switching element reduces the collector-emitter voltage Vce applied across each of the short-circuited high- and low-side switching elements.

Because the voltage drop across the busbar portion of the first overcurrent conductive path is greater than that across the corresponding busbar portion of the second overcurrent conductive path, the collector-emitter voltage Vce of each of the high- and low-side switching elements of the different short-circuited phases is lower than that of a corresponding one of the high- and low-side switching elements of the same short-circuited phase.

A decrease in the collector-emitter voltage Vce during the turn-on transient period (see the period from the time t31 to the time t32) of the switching element S∀# due to the occurrence of an inter-phase short-circuit causes the slope of the actual change curve of the sense voltage Vse to be lower than that of a predicted change curve Vd1 of the sense voltage Vse. The change curve Vd1 is predicted based on the actual change curve of the collector current Ice.

Specifically, due to the occurrence of an inter-phase short-circuit, the sense voltage Vse basically rises with an increase in the collector current Ice, but the slope of the change curve of the sense voltage Vse is lower than that of the predicted change curve Vd1 thereof. This is because the collector-emitter voltage Vce during the on state of the constant-current switching element 34 limits the increase in the sense voltage Vse. That is, the potential difference from the emitter to the collector of the switching element S∀# via the collector-current conductive path thereof is substantially identical to that from the emitter to the collector of the switching element S∀# via the sense resistor 52 and the sense terminal St, The decrease in the slope of the change curve of the sense voltage Vse relative to that of the predicted change curve Vd1 thereof during the turn-on transient period of the switching element S∀# causes the sense voltage Vse to have not reached the first threshold voltage SC within the clamp-filter time $T_{clamp}$. This results in turn-off of the clamping switching element 42 at the end of the clamp-filter time $T_{clamp}$ (see time t31a) although the sense voltage Vse has not reached the first threshold voltage SC.

For this reason, after the turn-off of the clamping switching element 42 at the time t31a, the gate voltage Vge rises up to the upper limit VH, resulting in an increase of the collector current Ice flowing through the switching element S∀#. While the collector current Ice flowing through the switching element S∀# is increasing, at the time t32 or thereabout, the sense voltage Vse rises up to a value correlated with an excessively high level of the collector current Ice at the time t32 or thereabout, exceeding the first threshold voltage SC. The sense voltage Vse exceeding the first threshold voltage SC turns on the soft-turnoff switching element 50 while the collector current Ice having the excessively high level is flowing through the switching element S∀# as an overcurrent. This causes a high surge voltage to be produced at the soft-turnoff of the switching element S∀#, which may reduce the reliability of the switching element S∀#.

Particularly, the lower the input voltage VL to the inverter IV is, the lower the collector-emitter voltage Vce during the turn-on transient period of the switching element S∀# is. This feature further reduces the slope of the actual change curve of the sense voltage Vse as compared with that of the predicted change curve Vd1 of the sense voltage Vse. Thus, the input voltage VL to the inverter IV having a given low value increases the period until the soft-turnoff task is executed, which may result in a further increase of the collector current Ice during execution of the soft-turnoff task.

Figure 8:
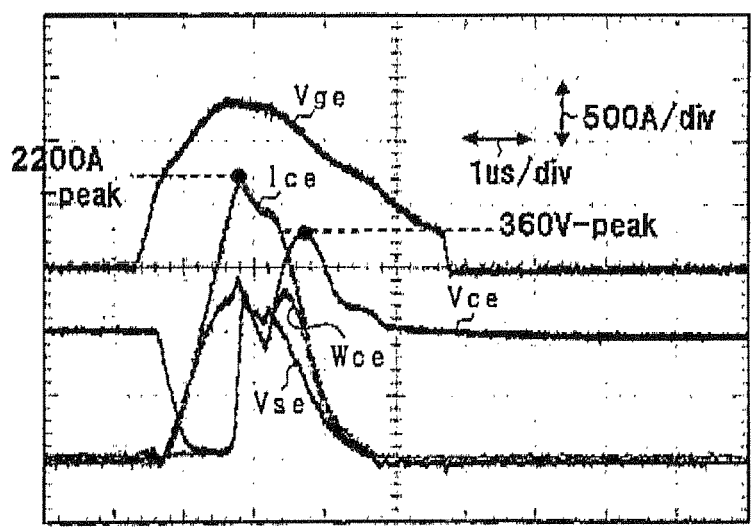
FIG. 8 is a graph schematically illustrating how the gate voltage, the sense voltage, the collector-emitter voltage, the collector current, and the loss of the switching element vary if an overcurrent flows through the switching element due to the occurrence of an upper-lower arm short-circuit in an enlarged scale relative to FIG. 6.
Figure 9:
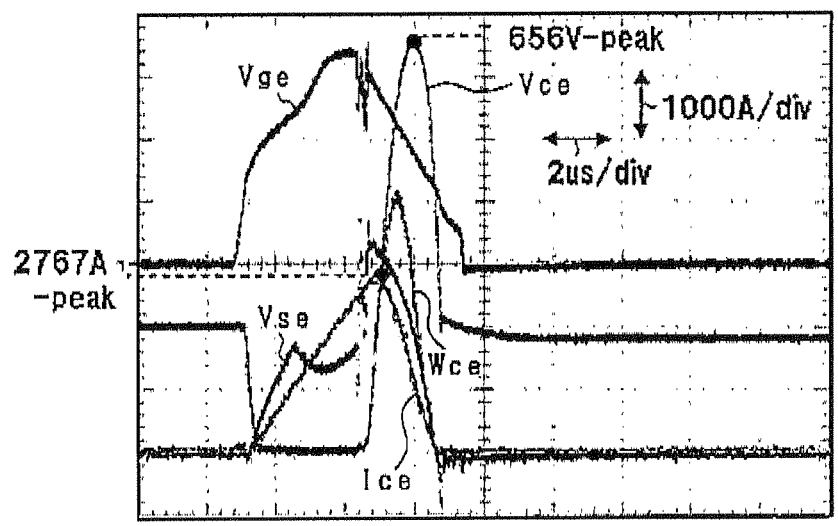
FIG. 9 is a graph schematically illustrating how the gate voltage, the sense voltage, the collector-emitter voltage, the collector current, and the loss of the switching element vary if an overcurrent flows through the switching element due to the occurrence of an inter-phase short-circuit in an enlarged scale relative to FIG. 7.

FIG. 8 schematically illustrates how the gate voltage Vge, the sense voltage Vse, the collector-emitter voltage Vce, the collector current Ice, and the loss Wce of the switching element S∀# vary if an overcurrent flows through the switching element S∀# due to the occurrence of an upper-lower arm short-circuit in an enlarged scale relative to FIG. 6. FIG. 9 schematically illustrates how the gate voltage Vge, the sense voltage Vse, the collector-emitter voltage Vce, the collector current Ice, and the loss Wce of the switching element S∀# vary if an overcurrent flows through the switching element S∀# due to the occurrence of an inter-phase short-circuit in an enlarged scale relative to FIG. 7.

Note that the vertical-axis scales for the parameters except for the collector current Ice are identical to each other, but the vertical-axis scale for the collector current Ice in FIG. 9 is two times that for the collector current Ice in FIG. 8. In addition, the horizontal-axis scale of FIG. 9 is two times that of FIG. 8.

FIGS. 8 and 9 demonstrate that the peak of the collector current Ice for the case of an inter-phase short-circuit, which is, for example, 2,767 A, is higher than that of the collector current Ice for the case of an upper-lower arm short-circuit, which is, for example, 2,200 A. FIGS. 8 and 9 also demonstrate that the peak of the collector-emitter voltage Vce for the case of an inter-phase short-circuit, which is, for example, 656 V, is higher than that of the collector-emitter voltage Vce for the case of an upper-lower arm short-circuit, which is, for example, 360 V. For this reason, the loss energy based on the loss Wce of the switching element S∀# for the case of an inter-phase short-circuit illustrated in FIGS. 7 and 9 is greater than that based on the loss Wce of the switching element S∀# for the case of an upper-lower arm short-circuit illustrated in FIGS. 6 and 8.

For example, in FIG. 8, the area formed by the collector-emitter voltage Vce during the on state of the constant-current switching element 34 and the waveform of the loss Wce of the switching element S∀# for the case of an upper-lower arm short-circuit shows the loss energy, such as 0.56 J, based on the loss Wce of the switching element S∀# therefor. Similarly, in. FIG. 9, the area formed by the collector-emitter voltage Vce during the on state of the constant-current switching element 34 and the waveform of the loss Wce of the switching element S∀# for the case of an inter-phase short-circuit shows the loss energy, such as 1.39 J, based on the loss Wce of the switching element S∀# therefor. That is, the increase in the loss energy for the case of an inter-phase short-circuit relative to that in the loss energy for the case of an upper-lower arm short-circuit causes the reliability of the switching element S∀# to be reduced.

In order to address such a problem, each of the drive units DU for a corresponding switching element S∀# is configured to:

perform the clamp extending task to extend the clamp-filter time $T_{clamp}$ if the sense voltage Vse exceeds a second threshold voltage OC within the period during which the clamp-filter time $T_{clamp}$ has elapsed since turn-on of the clamping switching element 42 by the clamping task.

The second threshold voltage QC is set to be higher than zero and lower than the first threshold voltage SC.

The clamp extending task makes it possible to perform the soft-turnoff task while the gate voltage Vge is limited to be equal to or lower than the clamp voltage $V_{clamp}$ even if there is an inter-phase short-circuit in a switching element S∀#. This prevents the peak of the collector current Ice and the increase in a produced surge voltage during the soft-turnoff of the switching element S∀# from increasing.

An example of a specific routine for the clamp extending task will be described hereinafter with reference to FIG. 10. Note that the drive controller 54 of each drive unit DU can be configured as a programmed logic circuit, a hard-wired logic circuit, or the combination of hardwired-logic and programmed-logic hybrid circuits, and can repeatedly carry out the routine, i.e. the clamp extending routine, every switching cycle as an example. The drive controller 54 is configured to serve as a setting module to execute the clamp extending routine as an example of a routine to variably set the length of the clamp-filter time $T_{clamp}$.

When launching the clamp extending routine, the drive controller 54 determines whether the drive signal g∀# for the switching element S∀# is the on-drive command in step S10.

Upon determination that the drive signal g∀# for the switching element S∀# is the on-drive command (YES in step S10), the clamp extending routine proceeds to step S12. In step S12, the drive controller 54 determines whether the sense voltage Vse has exceeded the second threshold value OC. The operation in step S12 serves as an operation for determining whether to extend the clamp-filter time $T_{clamp}$.

Upon determination that the sense voltage Vse has exceeded the second threshold value OC (YES in step S12), the drive controller 54 extends the clamp-filter time $T_{clamp}$ in step S14. That is, the drive controller 54 according to the first embodiment is programmed to, after determining that the sense voltage Vse has exceeded the second threshold voltage OC, extend the clamp-filter time $T_{clamp}$, in other words, continue turn-on of the clamping switching element 42, until the sense voltage Vse exceeds the first threshold voltage SC in step S14. The second threshold voltage OC can be determined such that the sense voltage Vse, which has exceeded the second threshold voltage 00 until the clamp-filter time $T_{clamp}$ elapses, is quite likely to exceed the first threshold voltage SC.

Otherwise, upon determination that the drive signal g∀# for the switching element SV# is not the on-drive command (NO in step S10), or that the sense voltage Vse has not exceeded the second threshold value OC (NO in step S12), the drive controller 54 terminates the clamp extending routine. In addition, when the operation in step S14 is completed, i.e. the sense voltage Vse has exceeded the first threshold voltage SC, the drive controller 54 terminates the clamp extending routine.

FIG. 11 schematically illustrates how the same parameters as those illustrated in FIG. 7 vary based on the clamp extending task if overcurrent due to an inter-phase short-circuit flows through a corresponding switching element S∀#.

As illustrated in FIG. 11, when the constant-current switching element 34 is turned on in response to when the drive signal g∀# is changed to the on-drive command at time t41 (see YES in step S10). This operation causes the gate voltage Vge to start increasing. The increase in the gate voltage Vge causes the collector current Ice to start flowing, resulting in an increase of the sense voltage Vse.

Thereafter, when the gate voltage Vge reaches the preset voltage Vα at time t41a (see the time t13 illustrated in FIG. 4), the drive controller 54 starts output of the enable signal to the operational amplifier 44. This results in execution of the clamping task, which turns on the clamping switching element 42 at the time t41a, and maintains it in the on state for the clamp-filter time $T_{clamp}$ from the time t41a. The clamping task clamps the gate voltage Vge to be equal to or lower than the clamp voltage $V_{clamp}$ before reaching the upper limit VH, thus limiting an increase in the collector current Ice.

Thereafter, when it is determined that the sense voltage Vse has exceeded the second threshold voltage OC at time t42 (see YES in step S12), the operation to extend the clamp-filter time $T_{clamp}$ in step S14 is carried out. Thus, if the clamp extending task were not executed by the drive controller 54, the clamping task could be terminated at time t43, in other words, the end timing of the clamp-filter time $T_{clamp}$ could be set to the time t43.

However, executing the clamp extending task makes it possible to continue the clamping task although the current time is equal to the time t43, i,e. extend the end timing of the clamp-filter time $T_{clamp}$ to time t44 until which the sense voltage Vse exceeds the first threshold voltage SC. Thus, at the time t44, the soft-turnoff task is carried out to turn on the soft-turnoff switching element 50, causing the switching element S∀# to be forcibly turned off. At the time t44, because the collector current Ice is kept to be a lower value, it is possible to prevent the surge voltage produced due to the soft-turnoff of the switching element S∀# from increasing.

As described above, each of the drive units DU for a corresponding switching element S∀# is configured to:

perform the clamp extending task to extend the clamp-filter time $T_{clamp}$ if the sense voltage Vse has exceeded the second threshold voltage QC within the period during which the clamp-filter time $T_{clamp}$ has elapsed since turn-on of the clamping switching element 42 by the clamping task.

The configuration makes it possible to perform the soft-turnoff task while the gate voltage Vge is clamped to be equal to or lower than the clamp voltage $V_{clamp}$ even if there is an inter-phase short-circuit in a switching element S∀#. This prevents the magnitude of the collector current Ice from increasing at the soft-turnoff timing of the switching element S∀# to thereby reduce the magnitude of a surge voltage produced due to the soft-turnoff of the switching element S∀#. This results in the reliability of the switching element S∀# for each drive unit DU being maintained at a higher level.

The configuration limits the gate voltage Vge to be equal to or lower than the clamp voltage $V_{clamp}$ until the soft-turnoff task is carried out, thus reducing the energy loss in the switching element S∀# even if an overcurrent flows through the switching element S∀#. This makes it possible to reduce the size, power consumption, and cost of each switching element S∀#.

Second Embodiment

A control system for controlling the motor-generator 10 according to a second embodiment of the present disclosure will be described with reference to FIG. 12.

The structure and/or functions of the control system according to the second embodiment are mainly identical to those of the control system according to the first embodiment except for the following points. So, the different points will be mainly described hereinafter.

Each drive unit DU provided for a corresponding one switching element S*# according to the second embodiment is designed such that the structure of a clamp circuit 40a is modified from that of the clamp circuit 40 according to the first embodiment.

Figure 12:
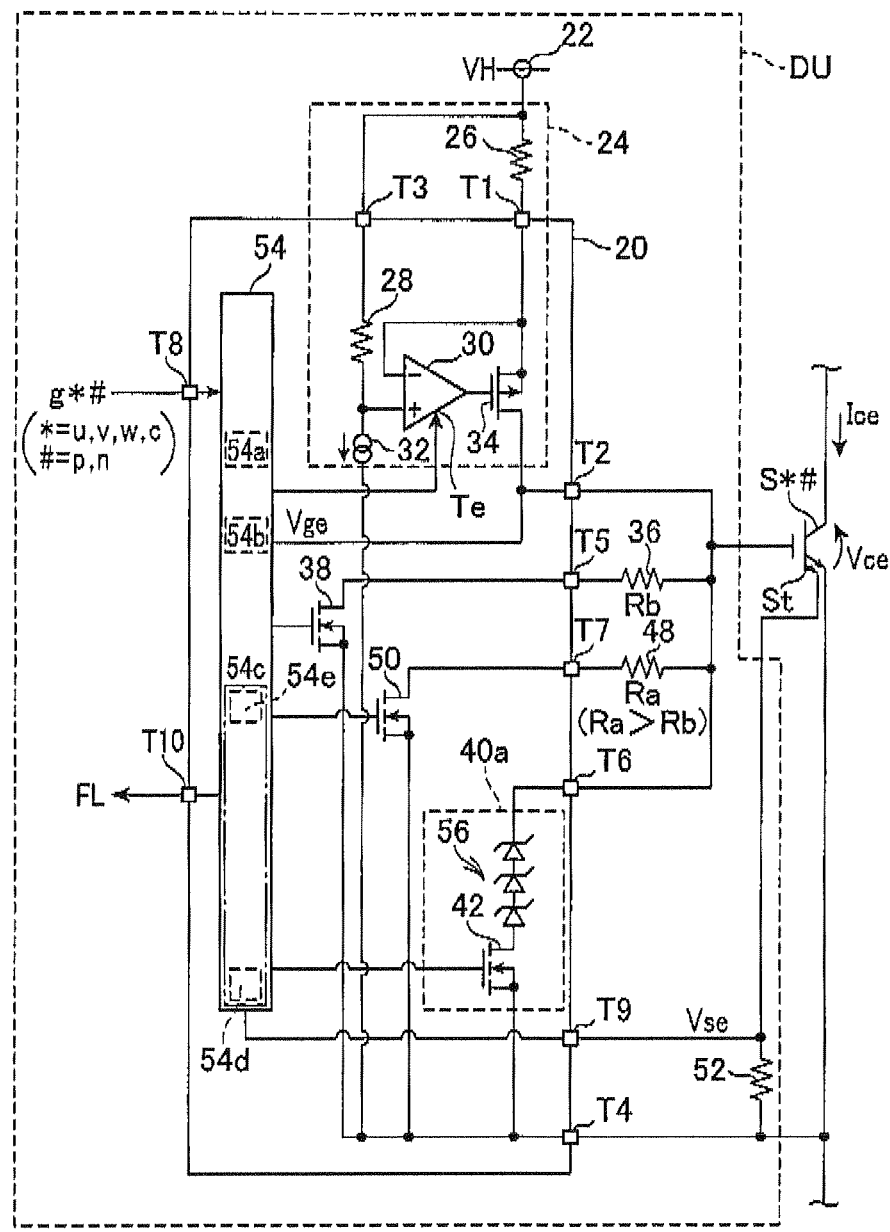
FIG. 12 is a circuit diagram schematically illustrating an example of the structure of each drive unit of a control system according to a second embodiment of the present disclosure.

FIG. 12 schematically illustrates an example of the structure of each drive unit DU provided for a corresponding one switching element S*# according to the second embodiment. Note that, in FIG. 12, the photocouplers 18a and the fail-safe unit 18b are omitted in illustration for simply illustration of the drive unit DU.

Referring to FIG. 12, the drive unit DU is comprised of a clamp circuit 40a as a series-connection member. The clamp circuit 40a is comprised of the clamping switching element 42 and series-connected Zener diodes 56. One end, i.e. the cathode, of the series-connected Zener diodes 56 is connected to the terminal T6, and the other end, i.e. the anode, thereof is connected to the drain of the clamping switching element 42. The source of the clamping switching element 42 is connected to the terminal T4. In other words, the terminal T6 is connected to the terminal T4 via the series connection of the series-connected Zener diodes 56 and the clamping switching element 42. The series-connected Zener diodes 56 have a breakdown voltage set to be equal to the clamp voltage $V_{clamp}$. The gate of the clamping switching element 42 is connected to the output terminal of the operational amplifier 44.

Specifically, as illustrated in FIG. 3, when the gate voltage Vge reaches the preset voltage Vα, which is set to be lower than the Miller voltage VM, at time t3, the drive controller 54 executes the clamping task. The clamping task turns on the clamping switching element 42, and maintains the clamping switching element 42 in the on state for the clamp-filter time $T_{clamp}$ from the time t3. Thus, if the gate voltage Vge is lower than the breakdown voltage (clamp voltage $V_{clamp}$), the gate voltage Vge increases. However, if the gate voltage Vge becomes equal to the clamp voltage $V_{clamp}$ at the time t3a, the gate voltage Vge is limited to the clamp voltage $V_{clamp}$.

As described above, the clamping task based on the clamp circuit 40a according to the second embodiment limits the gate voltage Vge to be equal to or lower than the clamp voltage $V_{clamp}$ before reaching its upper limit VH. This limiting function of the clamp circuit 40a is identical to that of the clamp circuit 40 according to the first embodiment. Because the remaining structure of each drive unit DU according to the second embodiment is identical to that of a corresponding drive unit DU according to the first embodiment, each drive unit DU according to the second embodiment achieves the same effects as those achieved by a corresponding drive unit DU according to the first embodiment.

Third Embodiment

Figure 13:
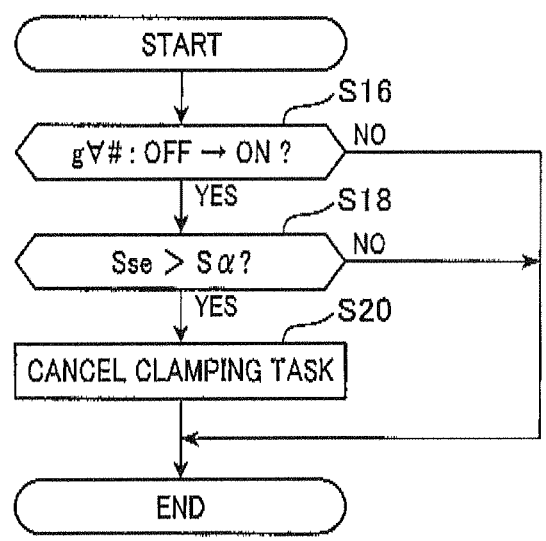
FIG. 13 is a flowchart schematically illustrating an example of a clamp cancelling routine carried out by each drive unit according to a third embodiment of the present disclosure.

A control system for controlling the motor-generator 10 according to a third embodiment of the present disclosure will be described with reference to FIGS. 13, 14A, and 14B.

The structure and/or functions of the control system according to the third embodiment are mainly identical to those of the control system according to the first embodiment except for the following points. So, the different points will be mainly described hereinafter.

Each drive unit DU provided for a corresponding one switching element S∀# according to the third embodiment is designed to perform a clamp cancelling task that cancels the clamping task if it is determined that no overcurrent flows through a corresponding one switching element S∀#.

An example of a specific routine for the clamp cancelling task will be described hereinafter with reference to FIG. 13. Note that the drive controller 54 of each drive unit DU according to the third embodiment can be configured as a programmed logic circuit, a hard-wired logic circuit, or the combination of hardwired-logic and programmed-logic hybrid circuits, and can repeatedly carry out the routine, i.e. the clamp cancelling routine every switching cycle as an example.

When launching the clamp cancelling routine, the drive controller 54 determines whether the drive signal g∀# for the switching element S∀# is changed from the off-drive command to the on-drive command in step S16.

Upon determination that the drive signal g∀# for the switching element S∀# is changed from the off-drive command to the on-drive command (YES in step S16), the clamp cancelling routine proceeds to step S18. In step S18, the drive controller 54 calculates the rate Sse of increase of the sense voltage Vse immediately after the change of the switching element S∀# from the off-drive command to the on-drive command.

Then, the drive controller 54 determines whether the calculated rate Sse of increase of the sense voltage Vse has exceeded a preset first rate Sα in step S18. The determining operation in step S18 serves as, for example, a determining module for determining whether a conductive path for an overcurrent is produced in the switching element S∀# based on the sense voltage Vse during the charge of the gate of the switching element S∀#. The operation in step S20 serves as, for example, a cancelling module configured to cancel the clamping task if it is determined that no conductive paths for an overcurrent are produced in the switching element S∀#.

Note that the preset rate a permits the drive controller 54 to determine whether the conductive path of an overcurrent is produced in the switching element S∀#. In the third embodiment, the first rate Sα is set to a maximum value of the rate Sse of increase of the sense voltage Vse if an upper-lower arm short-circuit occurs in the switching element S∀#. The reason why the rate Sse of increase of the sense voltage Vse is used as a parameter to determine whether the conductive path of an overcurrent is produced in the switching element S∀# is as follows.

Figure 14A:
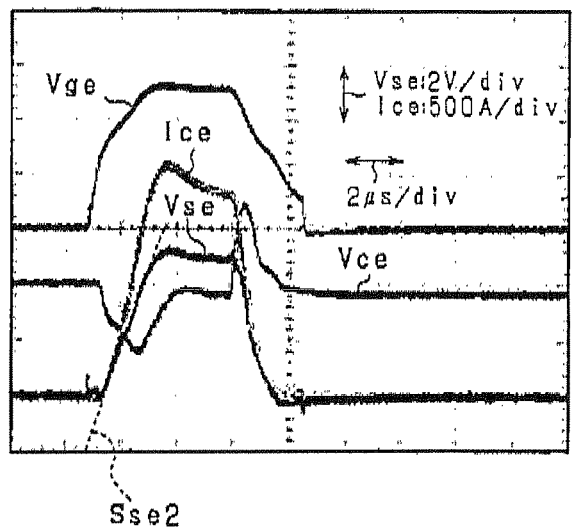
FIG. 14A is a graph schematically illustrating how the gate voltage, the sense voltage, the collector-emitter voltage, and the collector current vary if an overcurrent flows through a switching element due to the occurrence of an upper-lower arm short-circuit.

FIG. 14A schematically illustrates how the gate voltage Vge, the sense voltage Vse, the collector-emitter voltage Vce, and the collector current Ice vary if an overcurrent flows through the switching element S∀# due to the occurrence of an upper-lower arm short-circuit. In contrast, FIG. 14B schematically illustrates how the same parameters illustrated in FIG. 14A vary if the switching element S∀# operates normally, i.e. if no overcurrent flows through the switching element S∀#. Note that the vertical scale for the sense voltage Vse in FIG. 14A is two times of that for the sense voltage Vse in FIG. 14B, and the vertical scale for the collector current Ice in FIG. 14A is one-fifth of the vertical scale for the collector current Ice in FIG. 14B.

Figure 14B:
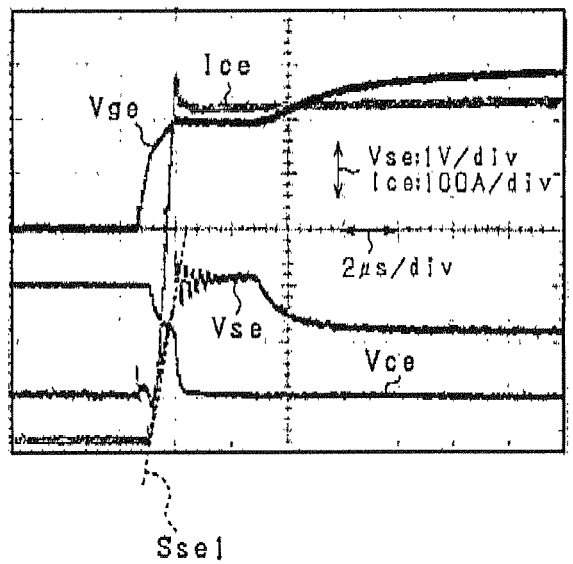
FIG. 14B is a graph schematically illustrating how the same parameters illustrated in FIG. 14A vary if a switching element operates normally.

Referring to FIG. 14B, the rate Sse of increase of the sense voltage Vse immediately after the change of the switching element S∀# from the off-drive command to the on-drive command if the switching element S∀# operates normally will be referred to as a first voltage-increase rate Sse1. Similarly, referring to FIG. 14A, the rate Sse of increase of the sense voltage Vse immediately after the change of the switching element S∀# from the off-drive command to the on-drive command if an overcurrent flows through the switching element S∀# due to the occurrence of an upper-lower arm short-circuit will be referred to as a second voltage-increase rate Sse2. As described above, the first voltage-increasing rate Sse1 for the normally operating switching element S∀# is usually higher than the second voltage-increasing rate Sse2 for the switching element S∀# with an upper-lower arm short-circuit.

How to specifically calculate the rate Sse of increase of the sense voltage Vse in step S18 is to calculate the time derivative of the sense voltage Vse immediately after the change of the switching element S∀# from the off-drive command to the on-drive command.

As a preferable example, the drive controller 54 according to the third embodiment completes the operation in step S18 before lapse of the Miller period. This reduces the amount of a current flowing from the constant-voltage source 22 to the terminal T4 during the on state of the clamping switching element 42 as a, clamp current, and reduces the conductive loss of the switching element ∀# due to the gate voltage Vge being limited to be equal to or lower than the clamp voltage $V_{clamp}$.

In step S18, upon determination that the calculated rate Sse of increase of the sense voltage Vse has exceeded the first rate Sα (YES in step S18), the drive controller 54 determines that no conductive path of an overcurrent is produced in the switching element S∀#. Then, the drive controller 54 carries out the operation in step S20 to cancel the clamping task.

Otherwise, upon determination that the drive signal g∀# for the switching element S∀# has not changed from the off-drive command to the on-drive command (NO in step S16), the drive controller 54 terminates the clamp cancelling task. In addition, upon determination that the calculated rate Sse of increase of the sense voltage Vse has not exceeded the first rate Sα, i.e. has been kept to be equal to or lower than the first rate Sα (NO in step S18), the drive controller 54 terminates the clamp cancelling task. Moreover, when the operation in step S20 is completed, i.e. the clamping task has been cancelled, the drive controller 54 terminates the clamp cancelling routine.

As described above, each drive unit DU according to the third embodiment achieves, in addition to the effects achieved in the first embodiment, the effects of reducing:

the amount of the clamp current flowing from the constant-voltage source 22 to the terminal T4 during the on state of the clamping switching element 42; and the conductive loss of the switching element ∀# due to the gate voltage Vge being limited to be equal to or lower than the clamp voltage $V_{clamp}$.

Fourth Embodiment

A control system for controlling the motor-generator 10 according to a fourth embodiment of the present disclosure will be described with reference to FIG. 15.

The structure and/or functions of the control system according to the fourth embodiment are mainly identical to those of the control system according to the first embodiment except for the following points. So, the different points will be mainly described hereinafter.

Figure 10:
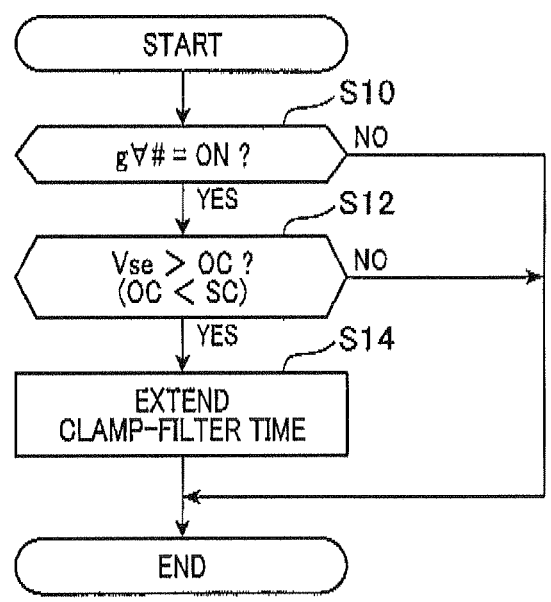
FIG. 10 is a, flowchart schematically illustrating an example of a clamp extending routine carried out by each drive unit of the control system illustrated in FIG. 1.

Each drive unit DU provided for a corresponding one switching element S∀# according to the fourth embodiment is designed to perform another clamp extending task to extend the clamp-filter time $T_{clamp}$, which is different from the clamp extending task described in the first embodiment as illustrated in FIG. 10.

An example of a specific routine for the clamp extending task according to the forth embodiment will be described hereinafter with reference to FIG. 15. Note that the drive controller 54 of each drive unit DU according to the fourth embodiment can be configured as a programmed logic circuit, a hardwired logic circuit, or the combination of hardwired-logic and programmed-logic hybrid circuits, and can repeatedly carry out the routine, i.e. the clamp extending routine every switching cycle as an example. In the clamp extending routines illustrated in the FIGS. 10 and 15, like reference numerals are assigned to like steps between the FIGS. 10 and 15.

Figure 15:
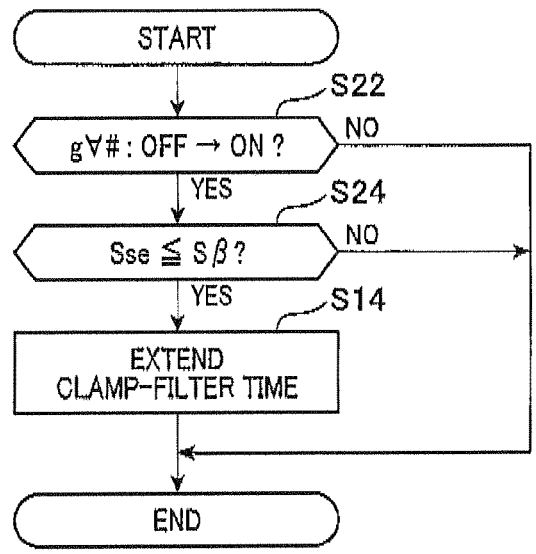
FIG. 15 is a flowchart schematically illustrating another example of the clamp extending routine carried out by each drive unit according to a fourth embodiment of the present disclosure.

When launching the clamp extending routine illustrated in FIG. 15, the drive controller 54 determines whether the drive signal g∀# for the switching element S∀# is changed from the off-drive command to the on-drive command in step S22.

Upon determination that the drive signal g∀# for the switching element S∀# is changed from the off-drive command to the on-drive command (YES in step S22), the clamp extending routine proceeds to step S24.

In step S24, the drive controller 54 calculates the rate Sse of increase of the sense voltage Vse immediately after the change of the switching element S∀# from the off-drive command to the on-drive command.

Then, the drive controller 54 determines whether the calculated rate Sse of increase of the sense voltage Vse is equal to or lower than a preset second rate Sβ in step S24. In the fourth embodiment, the second rate Sβ is set to a maximum value of the rate Sse of increase of the sense voltage Vse if an inter-phase short-circuit occurs in the switching element S∀#. The reason why the rate Sse of increase of the sense voltage Vse is used as a parameter to determine whether there is an inter-phase short circuit in the switching element S∀# is as follows.

As described in the first embodiment, the rate Sse of increase of the sense voltage Vse for the case of an interphase short-circuit is lower than that of increase of the sense voltage Vse for the case of an upper-lower arm short-circuit. In addition, as described in the third embodiment, the second voltage-increasing rate Sse2 for the switching element S∀# with an upper-lower arm short-circuit is usually lower than the first voltage-increasing rate Sse1 for the normally operating switching element S∀#. Thus, if there is an inter-phase short-circuit in the switching element S∀#, the rate Sse of increase of the sense voltage Vse immediately after the change of the switching element S∀# from the off-drive command to the on-drive command is equal to or lower than the second rate Sβ.

Upon determination that the calculated rate Sse of increase of the sense voltage Vse is equal to or lower than the preset second rate Sβ (YES in step S24), the drive controller 54 performs the clamp extending task to extend the clamp-filter time $T_{clamp}$ in step S14 described in the first embodiment.

Otherwise, upon determination that the drive signal g∀# for the switching element S∀# is not changed from the off-drive command to the on-drive command (NO in step S22), the drive controller 54 terminates the clamp extending task. In addition, upon determination that the calculated rate Sse of increase of the sense voltage Vse is higher than the second rate Sβ (NO in step S24), the drive controller 54 terminates the clamp extending task. Moreover, when the operation in step S14 is completed, i.e. the clamping task has cancelled, the drive controller 54 terminates the clamp extending routine.

As described above, the clamp extending task makes it possible to perform the soft-turnoff task while the gate voltage Vge is clamped to be equal to or lower than the clamp voltage $V_{clamp}$ even if there is an 2Q inter-phase short-circuit in a switching element S∀#. Thus, each drive unit DU according to the fourth embodiment achieves the same effects as those achieved in the first embodiment.

Fifth Embodiment

A control system for controlling the motor-generator 10 according to a fifth embodiment of the present disclosure will be described with reference to FIGS. 16 and 17.

The structure and/or functions of the control system according to the fifth embodiment are mainly identical to those of the control system according to the first embodiment except for the following points. So, the different points will be mainly described hereinafter.

Each drive unit DU provided for a corresponding one switching element S∀# according to the fifth embodiment is designed to perform a disabling task that disables limitation of the gate voltage Vge based on the clamping task during the period except for the clamp-filter time $T_{clamp}$. In other words, each drive unit DU is designed to disable execution of the clamping task even if the clamp circuit 40 erroneously operates due to noise during the period except for the clamp-filter time $T_{clamp}$.

In the fifth embodiment, the drive controller 54 has a disabling flag Fc, which is a bit of 0 or 1, stored therein. The disabling flag Fc being set to 1 represents that the drive controller 54 is disabled from performing the clamping task, and the disabling flag being set to 0 represents that the drive controller 1 is enabled to perform the clamping task. Note that an initial value of the disabling flag is set to 1.

Figure 16:
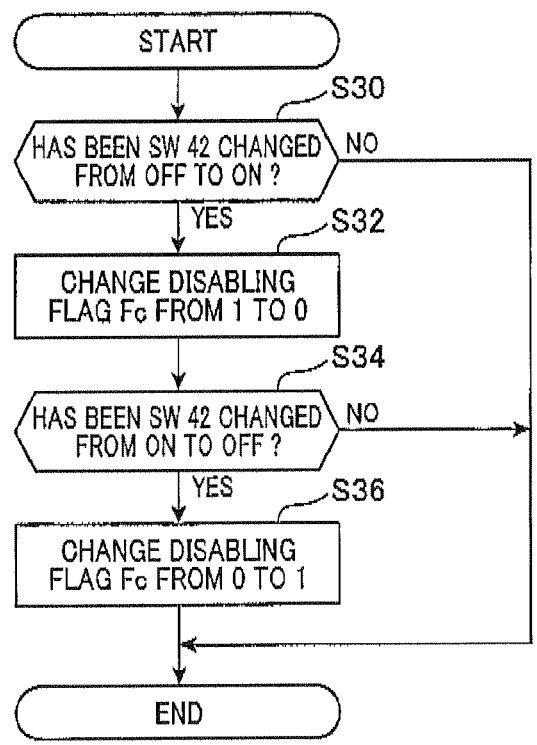
FIG. 16 is a flowchart schematically illustrating an example of a disabling routine carried out by each drive unit according to a fifth embodiment of the present disclosure.

FIG. 16 schematically illustrates an example of a specific routine for the disabling task. FIG. 17 schematically illustrates an example of specific operations of the disabling task executed by the drive controller 54 of the drive unit DU while the corresponding switching element S*# is normally operating. (a) to (f) of FIG. 17 illustrates how the corresponding parameters illustrated in FIG. 3 vary. In addition, (g) of FIG. 17 illustrates how the disabling flag Fc varies.

Note that the drive controller 54 of each drive unit DU according to the fifth embodiment can be configured as a programmed logic circuit, a hard-wired logic circuit, or the combination of hardwired-logic and programmed-logic hybrid circuits, and can repeatedly carry out the routine, i.e. the disabling routine every switching cycle as an example.

When launching the disabling routine, the drive controller 54 deter whether the clamping switching element 42 has been changed from the off state to the on state in step S30.

Figure 17:
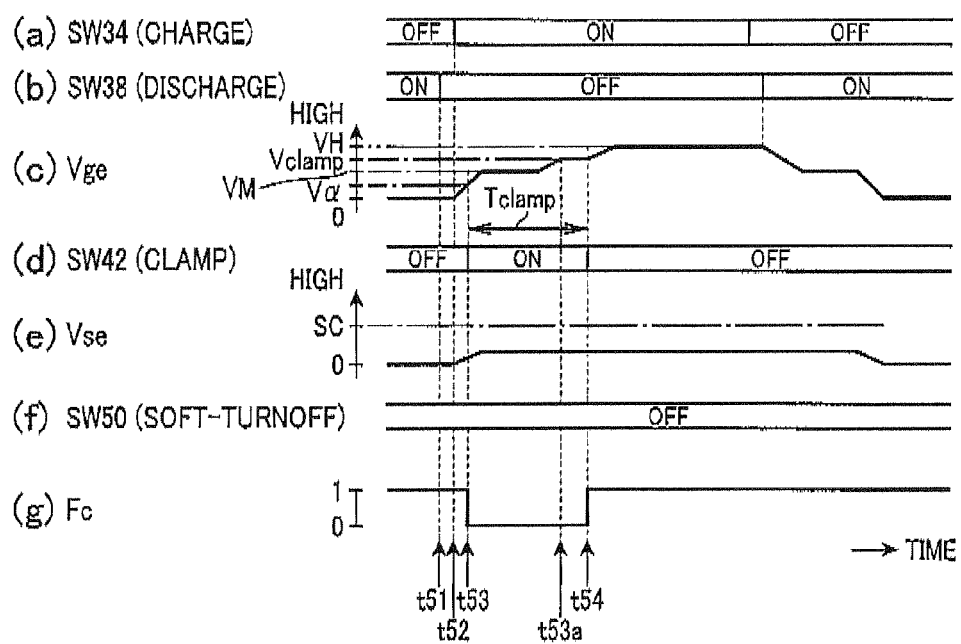
FIG. 17 is a timing chart schematically illustrating an example of specific operations of the disabling task executed by each drive unit while the corresponding switching element is normally operating according to the fifth embodiment.

Referring to FIG. 17, when the discharging switching element 38 is turned off at time t51, and thereafter, the constant-current switching element 34 is turned on at time t52. These operations cause the gate voltage Vge to start increasing. The increase in the gate voltage Vge causes the collector current Ice to start flowing, resulting in an increase of the sense voltage Vge.

Thereafter, when the gate voltage Vge reaches the preset voltage Vα at time t53, the drive controller 54 starts output of the enable signal to the operational amplifier 44, thus turning on the clamping switching element 42, and maintains it in the on state for the clamp-filter time $T_{clamp}$ from the time t53.

The turn-on of the clamping switching element 42 causes the determination in step S30 to be affirmative (YES in step S30). Thus, the drive controller 54 changes the disabling flag Fc from 1 to 0 in step S32. The disabling flag Fc being set to 0 enables the drive controller 54 to perform the clamping task, so that the clamping task is continuously carried out from the time t53.

Following the operation in step S32, the drive controller 54 determines whether the clamping switching element 42 has been changed from the on state to the off state in step S34.

After the time t53, when the clamp-filter time $T_{clamp}$ has elapsed since the time t53, the output of the enable signal to the operational amplifier 44 is stopped, resulting in turning off the clamping switching element 42 at time t54. The turn-off of the clamping switching element 42 causes the determination in step S34 to be affirmative. This results in the drive controller 54 performing the operation in step S36, which changes the disabling flag Fc from 0 to 1. This disables the drive controller 54 from executing the clamping task after the time t54, i.e. during the period except for the clamp-filter time $T_{clamp}$ every switching cycle. In other words, when the clamp-filter time $T_{clamp}$ has elapsed since the start of limitation of the gate voltage Vge by the clamping task at the time t53 (YES in step S34), the drive controller 54 disables execution of the clamping task in step S36. The operation in step S36 serves as, for example, a disabling module.

Note that extending the clamp-filter time $T_{clamp}$ based on the clamp extending task causes the period during which the disabling flag Fc is set to 1 to be extended.

Otherwise, upon determination that the clamping switching element 42 has not been changed from the off state to the on state (NO in step S30), the drive controller 54 terminates the disabling task. Upon determination that the clamping switching element 42 has not been changed from the on state to the off state (NO in step S34), the drive controller 54 terminates the disabling task. In addition, when the operation in step S36 is completed, i.e. the disabling flag Fc has been set to 1, the drive controller 54 terminates the disabling routine.

As described above, each drive unit DU according to the fifth embodiment achieves, in addition to the effects achieved in the first embodiment, the effect of preventing the clamp circuit 40 from erroneously operating due to noise.

Each of the first to fifth embodiments of the present disclosure can be modified as described hereinafter.

Each of the units 54a to 54e included in the drive controller 54 can be constructed by a hardware, software, or a hardware/software hybrid circuit.

The constant-current driving circuit 24 can be modified such that elements other than the resistor 26 and the constant-current switching element 34 can be eliminated.

The setting module is not limited to that described in each of the first to fifth embodiments.

In each of the first to fourth embodiments, the drive controller 54, serving as the setting module, is configured to extend the clamp-filter time $T_{clamp}$ until the sense voltage Vse exceeds the first threshold voltage SC, but the present disclosure is not limited thereto.

Specifically, upon determination that the sense voltage Vse has exceeded the second threshold value OC, the drive controller 54 can be designed to extend, in step S14, the clamp-filter time $T_{clamp}$ to a time that is slightly longer than the maximum value of time required from the timing when the gate voltage Vge exceeds the preset voltage Vα to the timing when the sense voltage Vse exceeds the first threshold voltage SC while there is an inter-phase short-circuit.

In the fourth embodiment, the drive controller 54 can be designed to extend, in step S14, the clamp-filter time $T_{clamp}$, during the on-drive command, at the timing when the sense voltage Vse, which was increased, is temporarily reduced (see time t31b in FIG. 7). In other words, the drive controller 54 can be designed to extend, in step S14, the clamp-filter time $T_{clamp}$, during the on-drive command, at the timing when the rate of decrease of the sense voltage Vse extends a preset is higher than a preset value. Specifically, as illustrated in FIG. 7, the sense voltage Vse is temporarily reduced if there is an inter-phase short-circuit in the switching element S∀#.

The drive controller 54, serving as the setting module, can be configured to select, every switching cycle, one of a plurality of candidates for the clamp-filter time $T_{clamp}$ based on the rate Sse of increase of the sense voltage Vse immediately after the change of the switching element S∀# from the off-drive command to the on-drive command.

The plurality of candidates for the clamp-filter time $T_{clamp}$ includes first time, second time, and third time.

The first time is set to be slightly longer than the maximum value of time required from the timing when the gate voltage Vge exceeds the preset voltage Vα to the timing when the sense voltage Vse exceeds the first threshold voltage SC while there is an upper-lower arm short-circuit.

The second time is set to be slightly longer than the maximum value of time required from the timing when the gate voltage Vge exceeds the preset voltage Vα to the timing when the sense voltage Vse exceeds the first threshold voltage SC while there is an inter-phase short-circuit.

The third time is set to be shorter than time required from the timing when the gate voltage Vge exceeds the preset voltage Vα to the timing of the end of Miller period.

Specifically, as illustrated in FIG. 18, the drive controller pedal Las the operation in step S22, and calculates the rate Sse of increase of the sense voltage Vse immediately after the change of the switching element S∀# from the off-drive command to the on-drive command in step S40.

Then, in step S40, the drive controller 54 determines, based on the rate Sse of increase of the sense voltage Vse, whether:

there is an upper-arm short-circuit in the switching element S∀#;

there is an inter-phase short-circuit in the switching element S∀#; or there is no overcurrent therein.

Upon determination that there is an overcurrent due to an upper-arm short-circuit in the switching element S∀#, the drive controller 54 selects the first time as the clamp-filter time $T_{clamp}$ in step S42.

Upon determination that there is an overcurrent due to an inter-phase short-circuit in the switching element S∀#, the drive controller 54 selects the second time as the clamp-filter time $T_{clamp}$ in step S44.

Upon determination that there is no overcurrent in the switching element SV#, the drive controller 54 selects the third time as the clamp-filter time $T_{clamp}$ in step S46.

In each of the embodiments, the clamp voltage $V_{clamp}$ can be set to a level lower than the Miller voltage VM and equal to or higher than a threshold voltage Vth at which the switching element is changed from the off state to the on state.

The determining module, which determines whether the conductive path of an overcurrent is produced in the switching element S∀# as a function of the rate Sse of increase of the sense voltage Vse, is not limited thereto. For example, the determining module can be designed to determine whether the conductive path of an overcurrent is produced in the switching element S∀# based on a value of the sense voltage Vse at the timing after preset time has elapsed since the change of the drive signal g∀# from the off-drive command to the on-drive command.

Let us assume that the rate Sse of increase of the sense voltage Vse if an inter-phase short-circuit occurs in the switching element S∀# will be referred to as a third voltage-increasing rate Sse3 for the switching element S∀# with an inter-phase short-circuit.

In this assumption, as described above, the second voltage-increasing rate Sse2 for the switching element S∀# with an upper-lower at arm short-circuit or the third voltage-increasing rate Sse3 therefor with an inter-phase short-circuit is usually lower than the first voltage-increasing rate Sse1 for the normally operating switching element S∀#. For this reason, a value of the sense voltage Vse at the timing after preset time has elapsed since the change of the drive signal g∀# from the off-drive command to the on-drive command for the switching element S∀# with an upper-lower arm short-circuit or an inter-phase short-circuit is lower than a value of the sense voltage Vse at the same timing for the normally operating switching element S∀#.

Thus, the determining module can determine whether the conductive path of an overcurrent is produced in the switching element S∀# based on a value of the sense voltage Vse at the timing after preset time has elapsed since the change of the drive signal g∀# from the off-drive command to the on-drive command.

In the fifth embodiment, the disabling module, in steps S34 and S36, can be configured to disable execution of the clamping task during a first period except for a second period every switching cycle; the first period is required from the timing when the gate voltage Vge starts to be limited to the timing when the limitation is cancelled. This modification can reduce the probability of the clamp circuit erroneously operating due to noise.

In each of the embodiments, the limiting module is configured to turn on the soft-turnoff switching element 50 immediately after it is determined that the sense voltage Vse exceeds the first threshold voltage SC, but the present disclosure is not limited thereto. Specifically, the limiting module can be configured to turn on the soft-turnoff switching element 50 if it is determined that the sense voltage Vse has exceeded the first threshold voltage SC for given time.

In each of the embodiments, the limiting module is configured to perform the soft-turnoff task to disable turn-on of the switching element S*# to prevent the flow of an excessively higher collector current Ice as an overcurrent, but the present disclosure is not limited thereto. Specifically, the limiting module can be configured to reduce the gate voltage Vge clown to a level; the level is set to be higher than the Miller voltage VM and lower than the clamp voltage $V_{clamp}$, thus limiting the flow of the collector current Ice, i.e. reducing the amount of the collector current Ice while permitting the flow of collector current Ice. In this modification, the overcurrent protecting task is effective if a surge voltage may increase due to the reduction of the collector current Ice.

In each of the embodiments, the resistor 52, serving as the measuring module, is configured to measure the sense current output from the sense terminal St of the corresponding switching element S*# as the sense voltage Vse, but the present disclosure is not limited thereto. Specifically, the measuring module can be designed as another type of measuring modules capable of measuring a parameter correlated with the sense current flowing through the conductive path between the sense terminal St and the emitter. For example, the measuring module can be equipped with a hall element or other similar sensing devices for measuring a parameter correlated with the sense current flowing through the conductive path between the sense terminal St and the emitter. In this modification, it is preferable that the conductive path has a given level of resistance for preventing a short-circuit between the sense terminal St and the emitter.

In each of the embodiments, an IGBT is used as a switching element S*# of each drive unit DU, but a MOSFET can be used as a switching element S*# of each drive unit DU.

In each of the embodiments, each drive unit DU for a corresponding one of the switching elements S∀# of the inverter IV is configured to perform the clamp extending task, but the present disclosure is not limited thereto. Specifically, each drive unit DU for a corresponding one of the switching elements Scp and Scn can be configured to perform the clamp extending task. In this modification, if a conductive path of an overcurrent is produced in a switching element Scp or Scn due to some cause, and the inductance of the conductive path of an overcurrent is greater than that of a conductive path of an overcurrent for an upper-lower arm short-circuit, the clamp extending task for the switching element Scp or Scn is effective in maintaining the reliability of the corresponding switching element Scp or Scn.

The drive units DU according to each of the embodiments are applied to a power converter, such as a converter CV or an inverter IV, installed in motor vehicles, but the present disclosure is not limited to the application. Specifically, the drive units DU can be applied to a power converter for driving another machine, such as a compressor for air-conditioning, and also can be applied to another device except for such power converters.

While an illustrative embodiment of the present disclosure has been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driver for driving a switching element having an input terminal, an output terminal, an on-off control terminal, and a sense terminal from which a sense current correlated with a current flowing between the input and output terminals is output, the driver comprising:
a charging module configured to charge the on-off control terminal of the switching element for turning on the switching element;
a clamping module configured to execute a clamping task that clamps a voltage at the on-off control terminal to be equal to or lower than a predetermined voltage as a clamp voltage for predetermined time during the charge of the on-off control terminal of the switching element, the clamp voltage being lower than an upper limit of the voltage at the on-off control terminal of the switching element;
a measuring module configured to measure a value of a parameter correlated with the sense current;
a limiting module configured to discharge the on-off control terminal to limit flow of the current between the input and output terminals if the value of the parameter measured by the measuring module exceeds a threshold value; and
a setting module configured to variably set a length of the predetermined time as a function of the value of the parameter measured by the measuring module during the charge of the on-off control terminal of the switching element.

2. The driver according to claim 1, wherein:
the threshold value is referred to as a first threshold value; and
the setting module is configured to extend the predetermined time if the value of the parameter exceeds a second threshold value within a period during which the predetermined time has elapsed since the voltage at the on-off control terminal of the switching element started to be clamped to the clamp voltage, the second threshold value being set to be higher than zero and lower than the first threshold value.

3. The driver according to claim 2, wherein:
the setting module is configured to extend the predetermined time until the value of the parameter measured by the measuring module exceeds the first threshold value.

4. The driver according to claim 2, further comprising:
a determining module configured to determine whether a conductive path for an overcurrent is produced in the switching element based on the value of the parameter measured by the measuring module during the charge of the on-off control terminal of the switching element; and
a cancelling module configured to cancel the clamping task if it is deter that no conductive paths for an overcurrent are produced in the switching element.

5. The driver according to claim 3, further comprising:
a determining module configured to determine whether a conductive path for an overcurrent is produced in the switching element based on the value of the parameter measured by the measuring module during the charge of the on-off control terminal of the switching element; and
a cancelling module cancelling module configured to cancel the clamping task if it is determined that no conductive paths for an overcurrent are produced in the switching element.

6. The driver according to claim 1, wherein:
the parameter correlated with to the sense current, which is measured by the measuring module, is a rate of change of the sense current;
the setting module is configured to variably set the length of the predetermined time as a function of a value of the rate of change of the sense current measured by the measuring module during the charge of the control terminal of the switching element.

7. The driver according to claim 1, wherein the rate of change of the sense current is a rate of increase of the sense current.

8. The driver according to claim 1, further comprising:
a discharging module configured to discharge the on-off control terminal of the switching element to decrease the voltage at the control terminal for turning off the switching element,
the charging module and discharging module being configured to perform the charge of the on-off control terminal of the switching element and the discharge of the on-off control terminal thereof every on-off cycle; and
a disabling module configured to disable execution of the clamping task within a given period during each on-off cycle, the given period being other than a period during which the predetermined time has elapsed since the voltage at the on-off control terminal of the switching element starts to be clamped to the clamp voltage.

9. The driver according to claim 1, wherein the clamping module:
comprises a clamping switching element having an on-off control terminal and connected between the on-off control terminal of the switching element and the output terminal thereof; and
controls a voltage to be applied to the on-off control terminal of the clamping switching element to turn on the clamping switching element, thus executing the clamping task.

10. The driver according to claim 1, wherein the clamping module:
comprises a series-connection member including at least one Zener diode and a clamping switching element connected thereto in series, the series-connection member being connected between the on-off control terminal of the switching element and the output terminal thereof, the at least one Zener diode having a breakdown voltage, the breakdown voltage being set to the clamp voltage; and
turns on the clamping switching element, thus executing the clamping task.

11. A control system for controlling a rotary machine, the control system comprising:
an inverter equipped with a pair of upper- and lower-arm switching elements, connected in series, for each of plural phases, each of the upper- and lower-arm switching elements having an input terminal, an output terminal, an on-off control terminal, and a sense terminal from which a sense current correlated with a current flowing between the input and output terminals is output; and
a driver for driving each of the upper- and lower-arm switching elements to thereby invert a DC voltage inputted to the inverter into an AC voltage to be supplied to the rotary machine, the driver for each of the upper- and lower-arm switching elements comprising:

a charging module configured to charge the on-off control terminal of the corresponding switching element for turning on the corresponding switching element;

so a clamping module configured to execute a clamping task that clamps a voltage at the control terminal to be equal to or lower than a predetermined voltage as a clamp voltage for predetermined time during the charge of the on-off control terminal of the corresponding switching element, the clamp voltage being lower than an upper limit of the voltage at the on-off control terminal of the corresponding switching element;

a measuring module configured to measure a value of a parameter correlated with the sense current;

a limiting module configured to discharge the on-off control terminal to limit flow of the current between the input and output terminals of the corresponding switching element if the value of the parameter measured by the measuring module exceeds a threshold value; and a setting module configured to variably set a length of the predetermined time as a function of the value of the parameter measured by the measuring module during the charge of the on-off control terminal of the corresponding switching element.

12. The control system according to claim 11, further comprising:

a determining module configured to determine, based on the value of the parameter measured by the measuring module, whether an overcurrent due to an upper-lower arm short-circuit occurs in the corresponding switching element, an overcurrent due to an inter-phase short-circuit occurs in the corresponding switching element, or no overcurrent occurs therein based on the value of the parameter measured by the measuring module, and the setting module is configured to change the length of the predetermined time as a result of the determination of whether an overcurrent due to the upper-lower arm short-circuit or an overcurrent due to the inter-phase short-circuit occurs in the corresponding switching element.

* * * * *